(12) United States Patent
Nakamura

(10) Patent No.: US 6,741,668 B1
(45) Date of Patent: May 25, 2004

(54) CLOCK RECOVERY CIRCUIT AND PHASE DETECTING METHOD THEREFOR

(75) Inventor: Satoshi Nakamura, Tokyo (JP)

(73) Assignee: NEC Electronics Corporation, Kanagawa (JP)

(*) Notice: Subject to any disclaimer, the term of this patent is extended or adjusted under 35 U.S.C. 154(b) by 608 days.

(21) Appl. No.: 09/593,932

(22) Filed: Jun. 15, 2000

(30) Foreign Application Priority Data

Jun. 17, 1999 (JP) .......................................... 11-170392

(51) Int. Cl.[7] .............................. H03D 3/24; G06F 9/45
(52) U.S. Cl. .................... 375/376; 375/372; 370/503
(58) Field of Search ................................ 375/376, 360, 375/372; 331/27; 327/43, 12, 24, 159; 370/503; 395/558, 551; 716/6

(56) References Cited

U.S. PATENT DOCUMENTS

| | | |
|---|---|---|
| 4,535,459 A | 8/1985 | Hogge, Jr. |
| 5,027,085 A | 6/1991 | DeVito |
| 5,602,512 A | 2/1997 | Neron |
| 5,712,580 A * | 1/1998 | Baumgartner et al. ......... 327/12 |
| 5,887,040 A * | 3/1999 | Jung et al. ................... 375/372 |
| 6,064,236 A * | 5/2000 | Kuwata et al. ............... 327/12 |
| 6,259,755 B1 * | 7/2001 | O'Sullivan et al. ......... 375/376 |
| 6,266,799 B1 * | 7/2001 | Lee et al. ....................... 716/6 |

FOREIGN PATENT DOCUMENTS

| | | |
|---|---|---|
| JP | 10-313303 | 11/1998 |
| WO | WO 98/45949 | 10/1998 |

OTHER PUBLICATIONS

Yonghui Tang; Geiger, R.L.; Circuits and Systems, 2000. Proceedings of the 43rd IEEE Midwest Symposium on, vol.: 1, Aug. 8–11, 2000, pp. 428–431 vol. 1.*
Japanese Patent Office Office Action dated Mar. 12, 2002 with English translation of encircled relevant parts.

* cited by examiner

*Primary Examiner*—Stephen Chin
*Assistant Examiner*—Cicely Ware
(74) *Attorney, Agent, or Firm*—Whitham, Curtis & Christofferson P.C.

(57) ABSTRACT

A clock recovery circuit provides a reference clock signal and a plurality of clock pulses with phases different from the reference clock signal, and has an edge detecting circuit for detecting positions of edges of inputted serial random data. A detected edge selecting circuit selects whether the edges of the inputted serial random data are rising edges or falling edges of the reference clock signal. An edge position correcting circuit assures that the number of the selected edges is equal to the number of the edges of the inputted serial random data. Phase frequency detectors output pulses of a pulse width in proportion to the phase difference between the inputted serial random data and the reference clock signal.

7 Claims, 9 Drawing Sheets

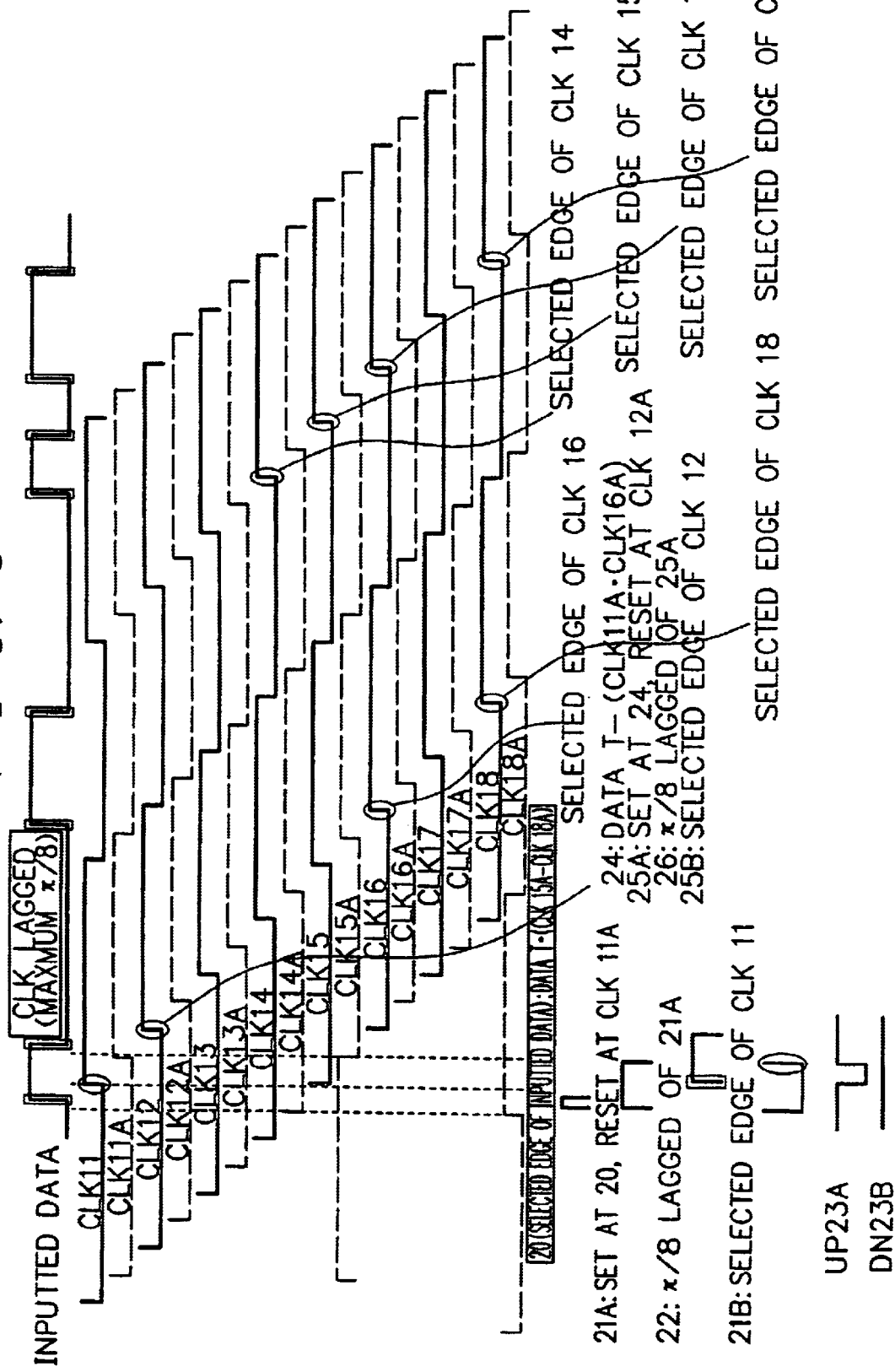

CLOCK RECOVERY CIRCUIT AND PHASE DETECTING METHOD THEREFOR

BACKGROUND OF THE INVENTION

The present invention relates to a clock recovery circuit being of high speed and low jitter in which a clock signal can be recovered by a clock signal of $1/\pi$ frequency of the data rate "n" bps (bit per second) of inputted serial random data and a phase detecting method which can realize this clock recovery circuit.

Description of the Related Art

FIG. 1 is a block diagram showing a conventional clock recovery circuit. As shown in FIG. 1, the conventional clock recovery circuit consists of a phase detector (PD) 101 which receives inputted serial random data having the data rate of "f" bps and compares the phase of a clock signal oscillating about "f" Hz generated by a voltage controlled oscillator (VCO) 104 with the phase of the received inputted serial random data, a charge pump (CP) 102 which receives up pulses and down pulses showing the result of the phase comparison at the PD 101 and supplies charge/discharge current in response to the up and down pulses to a loop filter (LPF) 103, the LPF 103 which removes unnecessary noise included in the output from the PD 101, and the VCO 104 which makes the oscillating frequency change in response to the charge/discharge current that is outputted from the CP 102 and is removed the noise at the LPF 103.

Generally, a Hogge type phase detector is used for comparing the phase of the inputted serial random data having the data rate of "f" bps with the phase of the clock signal of "f" Hz. FIG. 2 is a block diagram showing the Hogge type phase detector used for the conventional clock recovery circuit and a timing chart of output signals from the functions shown in FIG. 1. Referring to FIG. 2, structure and operation of the Hogge type phase detector are explained. The timing chart in FIG. 2 shows signal output timing of each function at the time when the clock signal lagged and led for the inputted serial random data and is synchronized with the inputted serial random data.

As shown in FIG. 2, the Hogge type phase detector consists of a delayed flip flop (F/F) 105 to which the serial random data and a clock signal (hereinafter referred to as CLK) A from a VCO (not shown) are inputted, an inverter 110 which inverts the CLK A, a delayed flip flop (F/F) 106 to which the output from the F/F 105 and a CLK B inverted the CLK A at the inverter 110 are inputted, an exclusive-or (EX-OR) circuit 107 to which the serial random data and the output from the F/F 105 are inputted, an EX-OR circuit 108 to which the outputs from the F/Fs 105 and 106 are inputted, and an inverter 109 which inverts the output from the EX-OR circuit 107.

At the Hogge type phase detector mentioned above, the EX-OR circuit 107 applies EX-OR for the waveform of the inputted serial random data and the waveform of the output from the F/F 105 which the CLK A is applied to the serial random data received at the F/F 105. The output from the EX-OR circuit 107 is inverted at the inverter 109 and outputted, this output is named as UP pulses (the waveform of the EX-OR 107 in FIG. 2).

And the EX-OR circuit 108 applies EX-OR for the waveform of the output from the F/F 105 and the waveform of the output from the F/F 106 which the CLK B is applied to the output from the F/F 105 at the F/F 106. The output from the EX-OR circuit 108 is named as DOWN pulses (the waveform of the EX-OR 108 in FIG. 2).

Referring to the waveforms of pulses shown in FIG. 2, the mentioned above UP and DOWN pulses are explained in cases that the phase of the clock signal lagged and led for the inputted serial random data, and is synchronized with the inputted serial random data. In this, the synchronized state is that the rising edge of the CLK A is at the center of the data.

As shown in FIG. 2, the width of the DOWN pulses is always constant at the time when the phase of the clock signal lagged or led for the inputted serial random data and are synchronized with the inputted serial random data. And the width of the DOWN pulses is ½ of the inputted serial random data.

On the other hand, the width of the UP pulses varies. That is, in case that the phase of the clock signal lagged for the inputted serial random data, the width is wide, in case that the phase of the clock signal is synchronized with inputted serial random data, the width is the same as the DOWN pulse, and in case that the phase of the clock signal led for the inputted serial random data, the width is narrow. In FIG. 2, the UP pulse is shown as a convex shape to the downward direction, and θe shows the phase difference between the clock signal and the inputted serial random data.

The net difference between the widths of the UP and DOWN pluses is used for a charging/discharging current to the LPF 103 through the CP 102. That is, when the phase of the clock signal lagged, the net width of the UP pulse becomes large, when the phase of the clock signal led, the net width of the DOWN pulse becomes large. And when the phase of the clock signal is synchronized with the phase of the inputted serial random data, the net difference between the widths of the UP and DOWN pulses becomes "0".

However, at the Hogge type phase detector mentioned above, as shown in FIG. 2, even when the phase of the clock signal is synchronized with the inputted serial random data, a large current flows through the CP 102 in response to the UP and DOWN pulses, therefore, there is a problem that the jitter characteristic at the synchronized state is deteriorated.

SUMMARY OF THE INVENTION

It is therefore an object of the present invention to provide a clock recovery circuit and a phase detecting method used for this circuit, in which a current flowing through a charge pump is made to zero at the time when the clock recovery circuit is synchronized, and the jitter characteristic is improved at the time when the clock recovery circuit is synchronized. And further another object of the present invention is to provide a clock recovery circuit and a phase detecting method used for this circuit which can perform high speed clock recovery not controlled by any oscillating frequency of a voltage controlled oscillator.

According to a first aspect of the present invention, for achieving the objects mentioned above, there is provided a clock recovery circuit. The clock recovery circuit provides multi phase clock signal generating means which generates a reference clock signal whose frequency is controlled to be about f/2 Hz for inputted serial random data whose data rate is "f" bit per second (bps), and also generates a plurality of clock pulses whose phases are different from the reference clock signal, edge detecting means for detecting rising edges and falling edges of the inputted serial random data, detected edge selecting means which selects whether the detected edges of the inputted serial random data are compared their phases with rising edges or falling edges of the reference clock signal, and outputs first edge pulses synchronized with edges which are judged to be compared their phases with the rising edges of the reference clock signal and second edge pulses synchronized with edges which are judged to be compared their phases with the falling edges of the reference clock signal, first edge position correction for comparing edges means which corrects so that the frequency of a first clock pulse becomes equal to the frequency of the first edge pulses by selecting only edges of the first clock pulses which perform phase comparison with the first edge pulses in the edges of the first clock pulses which are used at the phase comparison with the rising edges of the reference clock signal, and also makes edges of the first edge pulses lag by phase difference between the reference clock signal and the first clock pulse, second edge position correction for comparing edges means which corrects so that the frequency of a second clock pulse becomes equal to the frequency of the second edge pulses by selecting only edges of the second clock pulses which perform phase comparison with the second edge pulses in the edges of the second clock pulses which are used at the phase comparison with the falling edges of the reference clock signal, and also makes edges of the second edge pulses lag by phase difference between the reference clock signal and the second clock pulse, first phase frequency detecting means which compares phases between the first clock pulse whose frequency is equal to the frequency of the first edge pulses, outputted from the first edge position correction for comparing edges means, and the first edge pulses whose phases are made to lag by the phase difference, and outputs pulses of the pulse widths in proportion to the phase difference between the both compared pulses, and second phase frequency detecting means which compares phases between the second clock pulse whose frequency is equal to the frequency of the second edge pulses, outputted from the second edge position correction for comparing edges means, and the first edge pulses whose phases are made to lag by the phase difference, and outputs pulses of the pulse widths in proportion to the phase difference between the both compared pulses.

According to a second aspect of the present invention, in the first aspect, the plurality of clock pulses whose phases are different from the reference clock signal whose cycle is $2\pi$ is composed of a first clock pulse whose phase lags by $\pi/2$ for the reference clock signal and a second clock pulse whose phase leads by $\pi/2$ for the reference clock signal, and the edge detecting means provides a delay circuit which makes the phase of the inputted serial random data lag, and an exclusive-or (EX-OR) circuit to which the inputted serial random data and pulses that the inputted serial random data are made to lag at the delay circuit are inputted, and the detected edge selecting means provides a first AND circuit to which edge pulses being synchronized with rising edges and falling edges of the inputted serial random data outputted from the EX-OR circuit and the first clock pulse are inputted, and a second AND circuit to which edge pulses being synchronized with rising edges and falling edges of the inputted serial random data outputted from the EX-OR circuit and the second clock pulse are inputted, and the first edge position correction for comparing edges means provides a first set-reset flip flop (SR-F/F) whose set terminal pulses outputted from the first AND circuit are inputted to and whose reset terminal the first clock pulse is inputted to, and a first delay circuit which makes the pulses outputted from the first SR-F/F lag by $\pi/2$ phase, and the second edge position correction for comparing edges means provides a second SR-F/F whose set terminal pulses outputted from the second AND circuit are inputted to and whose reset terminal the second clock pulse is inputted to, and a second delay circuit which makes the pulses outputted from the second SR-F/F lag by $\pi/2$ phase, and the first phase frequency detecting (PFD) means compares phases between pulses outputted from the first delay circuit and an inverted output pulse from the first SR-F/F, and the second PFD means compares phases between pulses outputted from the second delay circuit and an inverted output pulse from the second SR-F/F.

According to a third aspect of the present invention, in the first aspect, the plurality of clock pulses whose phases are different from the reference clock signal whose cycle is $2\pi$ is composed of a first clock pulse whose phase lags by $\pi/2$ for the reference clock signal and a second clock pulse whose phase leads by $\pi/2$ for the reference clock signal, and the edge detecting means and the detected edge selecting means provides a first AND circuit to which the inputted serial random data, and pulses made to lag and inverted the inputted serial random data, and the second clock pulse are inputted, and a second AND circuit to which the inputted serial random data, and pulses made to lag and inverted the inputted serial random data, and the first clock pulse are inputted, and a third AND circuit to which inverted the inputted serial random data, and pulses made to lag the inputted serial random data, and the second clock pulse are inputted, and a fourth AND circuit to which inverted the inputted serial random data, and pulses made to lag the inputted serial random data, and the first clock pulse are inputted, and a first OR circuit to which outputs from the first and third AND circuits are inputted, and a second OR circuit to which outputs from the second and fourth AND circuits are inputted, and the first edge position correction for comparing edges means provides a first SR-F/F whose set terminal pulses outputted from the second OR circuit are inputted to and whose reset terminal the first clock pulse is inputted to, and a first delay circuit which makes the pulses outputted from the first SR-F/F lag by $\pi/2$ phase, and the second edge position correction for comparing edges means provides a second SR-F/F whose set terminal pulses outputted from the first OR circuit are inputted to and whose reset terminal the second clock pulse is inputted to, and a second delay circuit which makes the pulses outputted from the second SR-F/F lag by $\pi/2$ phase, and the first PFD means compares phases between pulses outputted from the first delay circuit and an inverted output pulse from the first SR-F/F, and the second PFD means compares phases between pulses outputted from the second delay circuit and an inverted output pulse from the second SR-F/F.

According to a fourth aspect of the present invention, there is provided a clock recovery circuit. The clock recovery circuit provides multi phase clock signal generating means which generates a plurality of reference clock signals whose phases are serially different respectively and whose frequency is controlled to be about f/n Hz (n is an integer) for inputted serial random data whose data rate is "f" bit per second (bps), and also generates a plurality of clock pulses whose phases are different from the plurality of reference clock signals by a designated value respectively, edge detecting means which detects rising edges and falling edges of the inputted serial random data and generates edge pulses synchronized with the rising and falling edges, detected edge selecting means which selects that the detected edges of the inputted serial random data at the edge detecting means are compared their phases with any of the reference clock signals generated at the multi phase clock generating means, and outputs edge pulses synchronized with selected edges of the inputted serial random data in each of the reference clock signals, edge position correction for comparing edges means which corrects so that the frequency of the clock pulses becomes equal to the frequency of edge pulses by selecting only edges using for phase comparison with the edge pulses in the edges of the clock pulses set each of the reference clock signals which are used at the phase comparison with edge pulses generated each of the reference clock signals, and also makes edges of the edge pulses lag by phase difference between the reference clock signals and the clock pulses set each of the reference clock signals, and phase frequency detecting means which compares phases between the clock pulses whose frequency is equal to the frequency of the edge pulses, outputted from the edge position correction for comparing edges means, and the edge pulses whose phases are made to lag by the phase difference, and outputs pulses of the pulse widths in proportion to the phase difference between the both compared pulses.

According to a fifth aspect of the present invention, in the fourth aspect, the reference clock signals whose cycle is $2\pi$ are composed of eight clock signals shifted by $\pi/4$ phase respectively, and the clock pulses are composed of eight clock pulses lagged by $\pi/8$ phase for each of the reference clock signals, and the edge detecting means provides a delay circuit which makes the phase of the inputted serial random data lag, and an exclusive-or (EX-OR) circuit to which the inputted serial random data and pulses that the inputted serial random data are made to lag at the delay circuit are inputted. And the clock recovery circuit further provides a first AND circuit which applies AND to the edge pulses, a fifth clock pulse lagged by $\pi/8$ phase for a fifth reference clock signal lagged by $\pi$ phase for a first reference clock signal, and an eighth clock pulse lagged by $\pi/8$ phase for an eighth reference clock signal lagged by $7\pi/4$ phase for the first reference clock signal, a second AND circuit which applies AND to the edge pulses, a first clock pulse lagged by $\pi/8$ phase for the first reference clock signal, and a sixth clock pulse lagged by $\pi/8$ phase for a sixth reference clock signal lagged by $5\pi/4$ phase for the first reference clock signal, a third AND circuit which applies AND to the edge pulses, a second clock pulse lagged by $\pi/8$ phase for a second reference clock signal lagged by $\pi/4$ phase for the first reference clock signal, and a seventh clock pulse lagged by $\pi/8$ phase for a seventh reference clock signal lagged by $3\pi/2$ phase for the first reference clock signal, a fourth AND circuit which applies AND to the edge pulses, a third clock pulse lagged by $\pi/8$ phase for a third reference clock signal lagged by $\pi/2$ phase for the first reference clock signal, and the eighth clock pulse lagged by $\pi/8$ phase for the eighth reference clock signal lagged by $7\pi/4$ phase for the first reference clock signal, a fifth AND circuit which applies AND to the edge pulses, a fourth clock pulse lagged by $\pi/8$ phase for a fourth reference clock signal lagged by $3\pi/4$ phase for the first reference clock signal, and the first clock pulse lagged by $\pi/8$ phase for the first reference clock signal, a sixth AND circuit which applies AND to the edge pulses, the fifth clock pulse lagged by $\pi/8$ phase for the fifth reference clock signal lagged by $\pi$ phase for the first reference clock signal, and the second clock pulse lagged by $\pi/8$ phase for the second reference clock signal lagged by $\pi/4$ phase for the first reference clock signal, a seventh AND circuit which applies AND to the edge pulses, the sixth clock pulse lagged by $\pi/8$ phase for the sixth reference clock signal lagged by $5\pi/4$ phase for the first reference clock signal, and the third clock pulse lagged by $\pi/8$ phase for the third reference clock signal lagged by $\pi/2$ phase for the first reference clock signal, an eighth AND circuit which applies AND to the edge pulses, the seventh clock pulse lagged by $\pi/8$ phase for the seventh reference clock signal lagged by $3\pi/2$ phase for the first reference clock signal, and the fourth clock pulse lagged by $\pi/8$ phase for the fourth reference clock signal lagged by $3\pi/4$ phase for the first reference clock signal, a first set-reset flip flop (SR-F/F) whose set terminal outputs from the first AND circuit are inputted to and whose reset terminal the first clock pulse is inputted to, a second SR-F/F whose set terminal outputs from the second AND circuit are inputted to and whose reset terminal the second clock pulse is inputted to, a third SR-F/F whose set terminal outputs from the third AND circuit are inputted to and whose reset terminal the third clock pulse is inputted to, a fourth SR-F/F whose set terminal outputs from the fourth AND circuit are inputted to and whose reset terminal the fourth clock pulse is inputted to, a fifth SR-F/F whose set terminal outputs from the fifth AND circuit are inputted to and whose reset terminal the fifth clock pulse is inputted to, a sixth SR-F/F whose set terminal outputs from the sixth AND circuit are inputted to and whose reset terminal the sixth clock pulse is inputted to, a seventh SR-F/F whose set terminal outputs from the seventh AND circuit are inputted to and whose reset terminal the seventh clock pulse is inputted to, an eighth SR-F/F whose set terminal outputs from the eighth AND circuit are inputted to and whose reset terminal the eighth clock pulse is inputted to, a first delay circuit which makes outputs from the first SR-F/F lag by $\pi/8$ phase, a second delay circuit which makes outputs from the second SR-F/F lag by $\pi/8$ phase, a third delay circuit which makes outputs from the third SR-F/F lag by $\pi/8$ phase, a fourth delay circuit which makes outputs from the fourth SR-F/F lag by $\pi/8$ phase, a fifth delay circuit which makes outputs from the fifth SR-F/F lag by $\pi/8$ phase, a sixth delay circuit which makes outputs from the sixth SR-F/F lag by $\pi/8$ phase, a seventh delay circuit which makes outputs from the seventh SR-F/F lag by $\pi/8$ phase, an eighth delay circuit which makes outputs from the eighth SR-F/F lag by $\pi/8$ phase, a first phase frequency detector (PFD) which compares the phases of pulses outputted from the first delay circuit with the phase of the inverted output pulse from the first SR-F/F and outputs pulses of the pulse widths in proportion to the phase difference between the compared pulses, a second PFD which compares the phases of pulses outputted from the second delay circuit with the phase of the inverted output pulse from the second SR-F/F and outputs pulses of the pulse widths in proportion to the phase difference between the compared pulses, a third PFD which compares the phases of pulses outputted from the third delay circuit with the phase of the inverted output pulse from the third SR-F/F and outputs pulses of the pulse widths in proportion to the phase difference between the compared pulses, a fourth PFD which compares the phases of pulses outputted from the fourth delay circuit with the phase of the inverted output pulse from the fourth SR-F/F and outputs pulses of the pulse widths in proportion to the phase difference between the compared pulses, a fifth PFD which compares the phases of pulses outputted from the fifth delay circuit with the phase of the inverted output pulse from the fifth SR-F/F and outputs pulses of the pulse widths in proportion to the phase difference between the compared pulses, a sixth PFD which compares the phases of pulses outputted from the sixth delay circuit with the phase of the inverted output pulse from the sixth SR-F/F and outputs pulses of the pulse widths in proportion to the phase difference between the compared pulses, a seventh PFD which compares the phases of pulses outputted from the seventh delay circuit with the phase of the inverted output pulse from the seventh SR-F/F and outputs pulses of the pulse widths in proportion to the phase difference between the compared pulses, and an eighth PFD which compares the phases of pulses outputted from the eighth delay circuit with the phase of the inverted output pulse from the eighth SR-F/F and outputs pulses of the pulse widths in proportion to the phase difference between the compared pulses.

According to a sixth aspect of the present invention, there is provided a phase detecting method, which is performed by phase frequency detectors that compare a phase of a reference clock signal whose frequency is controlled to be about f/2 Hz for inputted serial random data whose data rate is "f" bit per second (bps) with phases of the inputted serial random data and output pulses of the pulse widths in proportion to the phase difference between the compared result pulses of the reference clock signal and the inputted serial random data. The phase detecting method provides the steps of: generating multi clock signals being the reference clock signal whose frequency is controlled to be about f/2 Hz for the inputted serial random data whose data rate is "f" bps, and a plurality of clock pulses whose phases are different from the reference clock signal, detecting edges of rising edges and falling edges of the inputted serial random data, selecting whether the detected edges of the inputted serial random data are compared their phases with rising edges or falling edges of the reference clock signal, and outputting first edge pulses synchronized with edges which are judged to be compared their phases with the rising edges of the reference clock signal and second edge pulses synchronized with edges which are judged to be compared their phases with the falling edges of the reference clock signal, edge position correcting so that the frequency of a first clock pulse becomes equal to the frequency of the first edge pulses by selecting only edges of the first clock pulses which perform phase comparison with the first edge pulses in the edges of the first clock pulses which are used at the phase comparison with the rising edges of the reference clock signals, and making edges of the first edge pulses lag by phase difference between the reference clock signal and the first clock pulse, edge position correcting so that the frequency of a second clock pulses becomes equal to the frequency of the second edge pulses by selecting only edges of the second clock pulses which perform phase comparison with the second edge pulses in the edges of the second clock pulses which are used at the phase comparison with the falling edges of the reference clock signal, and making edges of the second edge pulses lag by phase difference between the reference clock signal and the second clock pulse, detecting phase frequency for comparing phases between the first clock pulses whose frequency is equal to the frequency of the first edge pulses, outputted at the edge position correcting, and the first edge pulses whose phases are made to lag by the phase difference, and outputting pulses of the pulse widths in proportion to the phase difference between the both pulses, and detecting phase frequency for comparing phases between the second clock pulses whose frequency is equal to the frequency of the second edge pulses, outputted at the edge position correcting, and the second edge pulses whose phases are made to lag by the phase difference, and outputting pulses of the pulse widths in proportion to the phase difference between the both pulses.

According to a seventh aspect of the present invention, there is provided a phase detecting method, which is performed by phase frequency detectors that compare phases of reference clock signals whose frequency is controlled to be about f/n (n is an integer) Hz for inputted serial random data whose data rate is "f" bit per second (bps) with phases of the inputted serial random data and output pulses of the pulse widths in proportion to the phase difference between the compared result pulses of the reference clock signals and the inputted serial random data. The phase detecting method provides the steps of: generating multi phase clock signals being a plurality of reference clock signals whose phases are serially different respectively and whose frequency is controlled to be about f/n Hz for inputted serial random data whose data rate is "f" bit per second (bps), and a plurality of clock pulses whose phases are different from the plurality of reference clock signals by a designated value, detecting edges of rising edges and falling edges of the inputted serial random data and generating edge pulses synchronized with the rising and falling edges, selecting detected edges of the inputted serial random data at the detecting edges are compared their phases with any of the reference clock signals generated at the multi phase clock generating, and outputting edge pulses synchronized with selected edges of the inputted serial random data in each reference clock signal, edge position correcting so that the frequency of the clock pulses becomes equal to the frequency of edge pulses by selecting only edges using for phase comparison with the edge pulses in the edges of the clock pulses set each of the reference clock signals which are used at the phase comparison with edge pulses generated each of the reference clock signals, and making edges of the edge pulses lag by phase difference between the reference clock signals and the clock pulses set each of the reference clock signals, and detecting phase frequency for comparing phases between the clock pulses whose frequency is equal to the frequency of the edge pulses, outputted at the edge position correcting, and the edge pulses whose phases are made to lag by the phase difference, and outputting pulses of the pulse widths in proportion to the phase difference between the both pulses.

BRIEF DESCRIPTION OF THE DRAWINGS

The objects and features of the present invention will become more apparent from the consideration of the following detailed description taken in conjunction with the accompanying drawings in which:

FIG. 9 is a timing chart of signals outputted from functions shown in FIG. 8.

DESCRIPTION OF THE PREFERRED EMBODIMENTS

Figure 1:
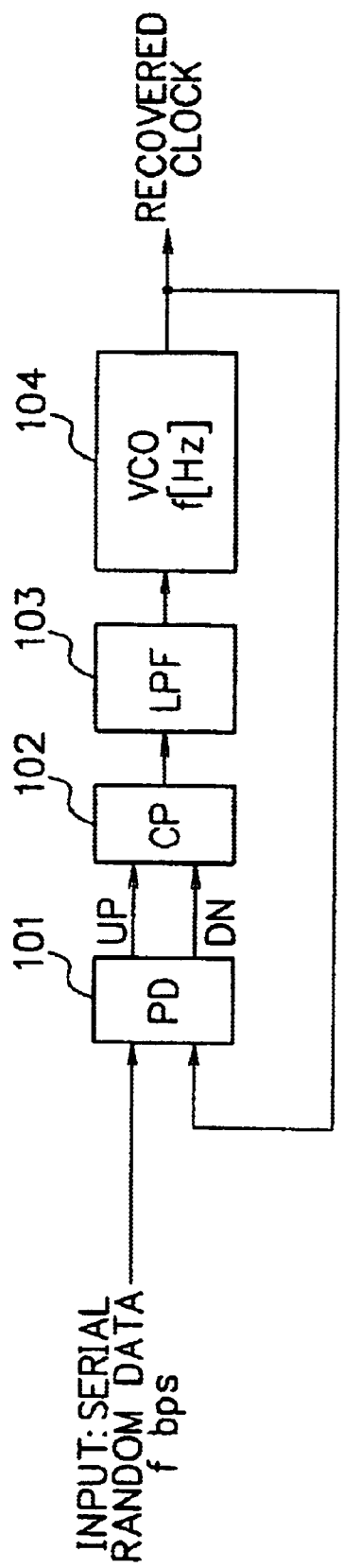
FIG. 1 is a block diagram showing a conventional clock recovery circuit.
Figure 2:
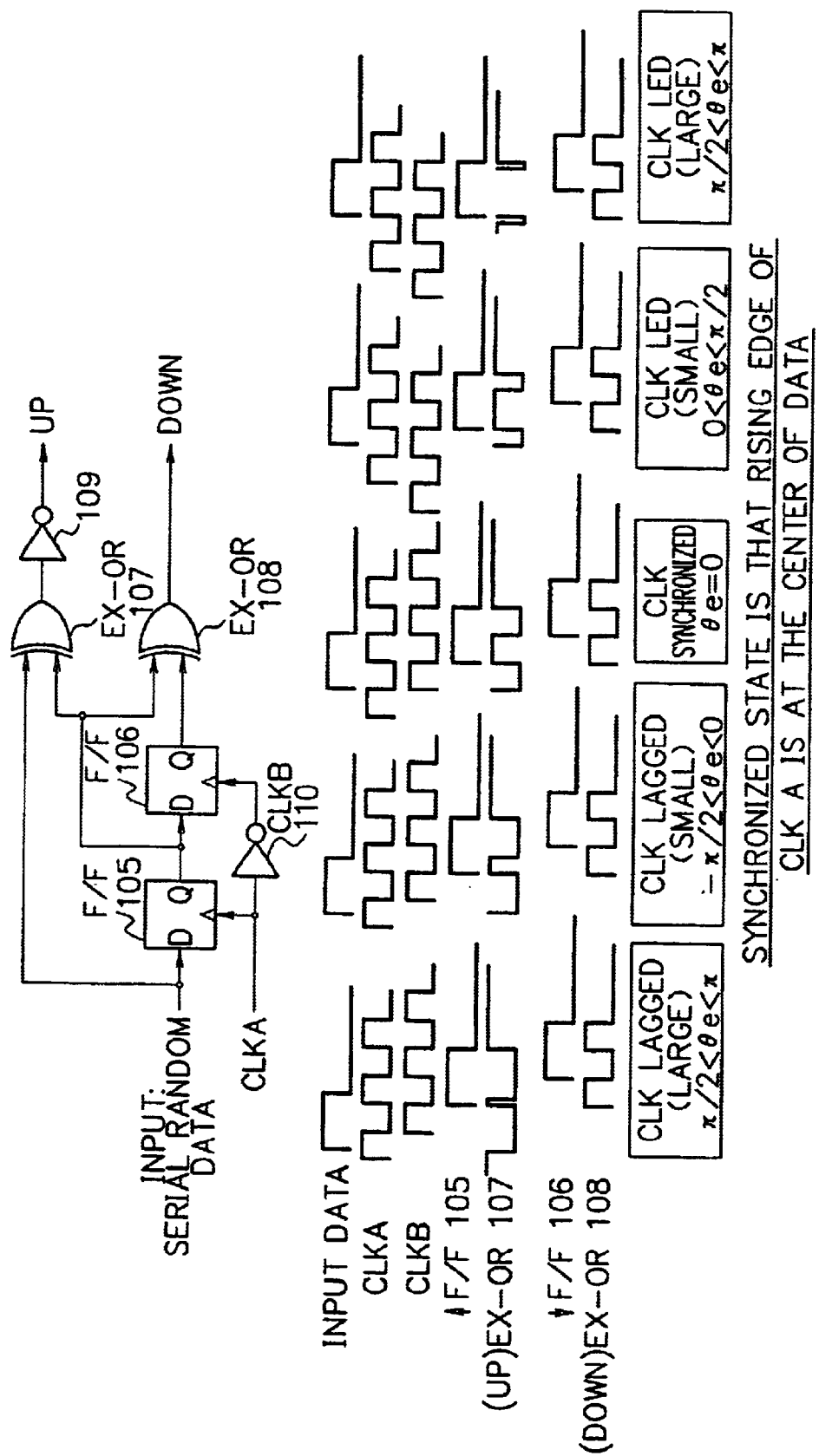
FIG. 2 is a block diagram showing a Hogge type phase detector used for the conventional clock recovery circuit and a timing chart of output signals from the functions shown in FIG. 1.
Figure 3:
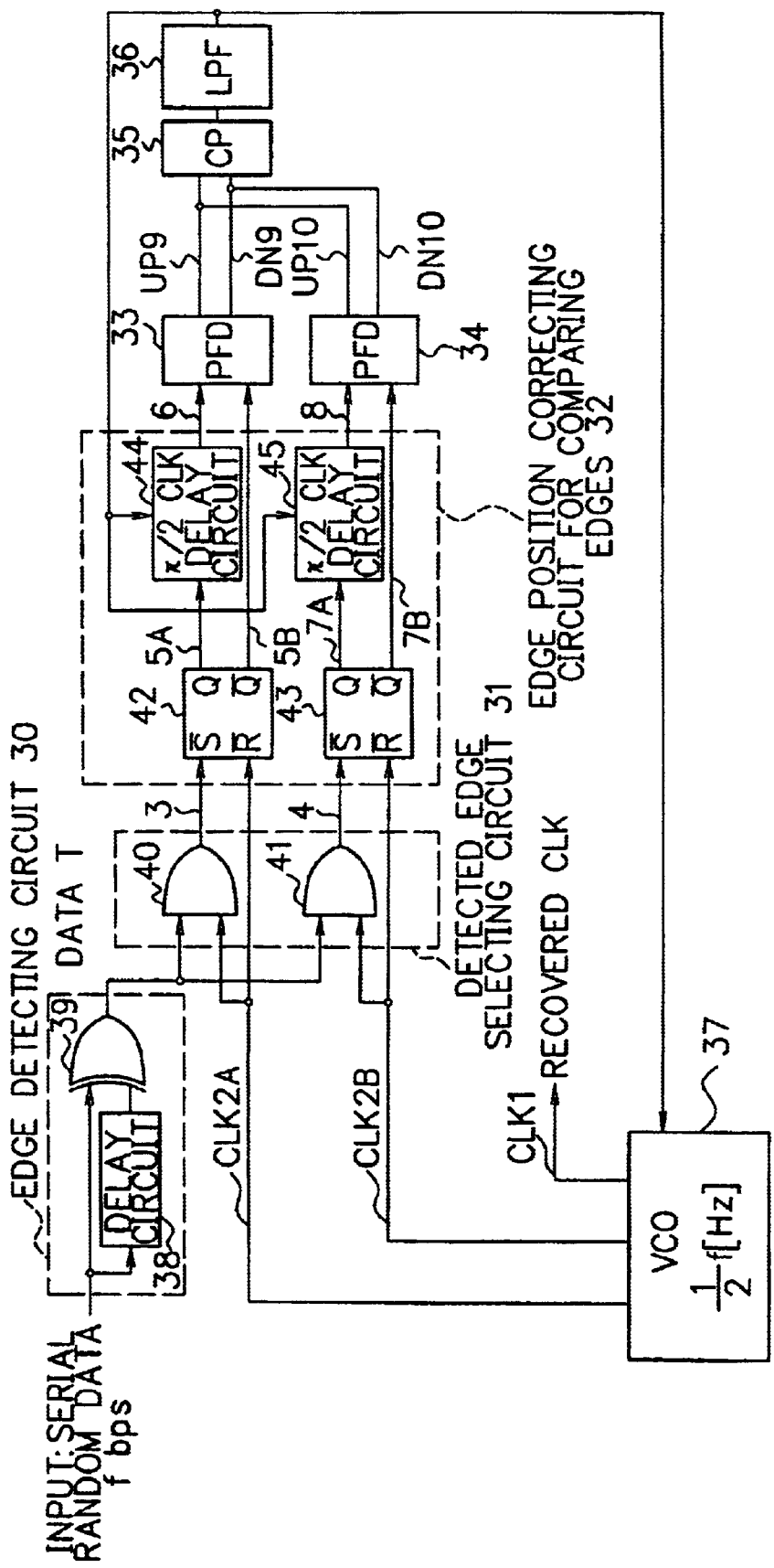
FIG. 3 is a block diagram showing a first embodiment of a clock recovery circuit of the present invention.

Referring now to the drawings, embodiments of the present invention are explained in detail. FIG. 3 is a block diagram showing a first embodiment of a clock recovery circuit of the present invention.

As shown in FIG. 3, the first embodiment of the clock recovery circuit of the present invention consists of an edge detecting circuit 30 which receives inputted serial random data having a data rate of "f" bps (bit per second) and detects positions of edges of the inputted serial random data, a detected edge selecting circuit 31 which selects the phase of any of multi phase clock signals from a voltage controlled oscillator (VCO) 37 to be compared with the edges of the inputted serial random data detected at the edge detecting circuit 30, an edge position correcting circuit for comparing edges 32 which corrects the number of edges of the selected multi phase clock signal so that the number of edges of the selected multi phase clock signal becomes equal to the number of edges of the inputted serial random data whose phases are compared with the selected multi phase clock signal, and corrects the positions of the edges of the inputted serial random data so that the positions become the right positions for comparing the phases, phase frequency detectors (PFDs) 33 and 34 which compare the phase of the multi phase clock signal outputted from the edge position correcting circuit for comparing edges 32 with the phases of edge pluses denoting the edge positions of the inputted serial random data, and output phase difference signals having pulse widths in response to the phase difference, a charge pump (CP) 35 which supplies a charging/discharging current in response to the phase difference to a loop filter (LPE) 36, the LPF 36 which removes unnecessary noise included in the output from the PFDs 33 and 34, and the VCO 37 which oscillates a reference clock signal (CLK) 1 being about f/2 Hz that is a ½ frequency of the data rate of the inputted serial random data by changing the oscillating frequency in response to the charging/discharging current removed the noise at the LPF 36. The VCO 37 generates not only the reference clock signal CLK 1 being about f/2 Hz whose phase and frequency are synchronized with the inputted serial random data but also generates a clock pulse CLK 2A whose phase lagged by π/2 for the CLK 1 and a clock pulse CLK 2B whose phase led by π/2 for the CLK 1.

The edge detecting circuit 30 consists of a delay circuit 38 to which the serial random data are inputted, and an EX-OR circuit 39 to which the serial random data and output pulses from the delay circuit 38 are inputted.

This edge detecting circuit 30 detects rising edges and falling edges of the inputted serial random data by inputting the serial random data and the lagged pulses of the inputted serial random data at the delay circuit 38 to the EX-OR circuit 39. The detected edges of the inputted serial random data are inputted to the detected edge selecting circuit 31 as edge pulses named DATA T.

The detected edge selecting circuit 31 consists of an AND circuit 40 to which the edge pulses DATA T from the edge detecting circuit 30 and the CLK 2A lagged by π/2 phase for the CLK 1 from the VCO 37 are inputted, and an AND circuit 41 to which the edge pulses DATA T from the edge detecting circuit 30 and the CLK 2B led by π/2 phase for the CLK 1 from the VCO 37 are inputted.

The detected edge selecting circuit 31 judges whether the edge pulses DATA T from the edge detecting circuit 30 are compared with the phases of the rising edges or the falling edges of the clock signal CLK 1 by using the CLK 2B led by π/2 phase for the CLK 1 and the CLK 2A lagged by π/2 phase for the CLK 1.

Actually, it is judged that the edges of the edge pulses DATA T obtained at the AND circuit 40 with the CLK 2A are compared with the phase of the falling edges of the CLK 1, and that the edges of the edge pulses DATA T obtained at the AND circuit 41 with the CLK 2B are compared with the phase of the rising edges of the CLK 1.

The edge position correcting circuit for comparing edges 32 consists of a set/reset flip flop (SR-F/F) 42 in which pulses 3 outputted from the AND circuit 40 are inputted to a set terminal of the SR-F/F 42 and the CLK 2A is inputted to a reset terminal of the SR-F/F 42, a SR-F/F 43 in which pulses 4 outputted from the AND circuit 41 are inputted to a set terminal of the SR-F/F 43 and the CLK 2B is inputted to a reset terminal of the SR-F/F 43, a π/2 CLK delay circuit 44 to which outputs from the SR-F/F 42 and an output from the LPF 36 are inputted, and a π/2 CLK delay circuit 45 to which outputs from the SR-F/F 43 and an output from the LPF 36 are inputted. In this, the π/2 is based on the cycle 2π of the reference clock signal oscillated at the VCO 37.

The edge position correcting circuit for comparing edges 32 makes the number of edges of the pulses outputted from the detected edge selecting circuit 31 equal to the number of edges of the CLK 1 to be compared their phases, and corrects phase errors added to the original phase difference at this process.

The SR-F/F 42 generates pulses 5A which rise at the rising edge of the pulses 3 outputted from the AND circuit 40 and fall at the rising edge of the CLK 2A. The SR-F/F 43 generates pulses 7A which rise at the rising edge of the pulses 4 outputted from the AND circuit 41 and fall at the rising edge of the CLK 2B. The π/2 CLK delay circuit 44 generates pulses 6 which made the phase of the pulses 5A outputted from the SR-F/F 42 lag by π/2. The π/2 CLK delay circuit 45 generates pulses 8 which made the phase of the pulses 7A outputted from the SR-F/F 43 lag by π/2.

The PFD 33 compares the phases of the pulses 6 having position information of the edges of the inputted serial random data with the phase of the pulses 5B having position information of the rising edges of the CLK 1 outputted from an inverse output terminal of the SR-F/F 42, and generates UP pulses 9 and DOWN pulses 9 having the pulse width proportioned to the phase difference.

The PFD 34 compares the phases of the pulses 8 having position information of the edges of the inputted serial random data with the phases of the pulses 7B having position information of the falling edges of the CLK 1 outputted from an inverse output terminal of the SR-F/F 43, and generates UP pulses 10 and DOWN pulses 10 having the pulse width proportioned to the phase difference.

Figure 4:
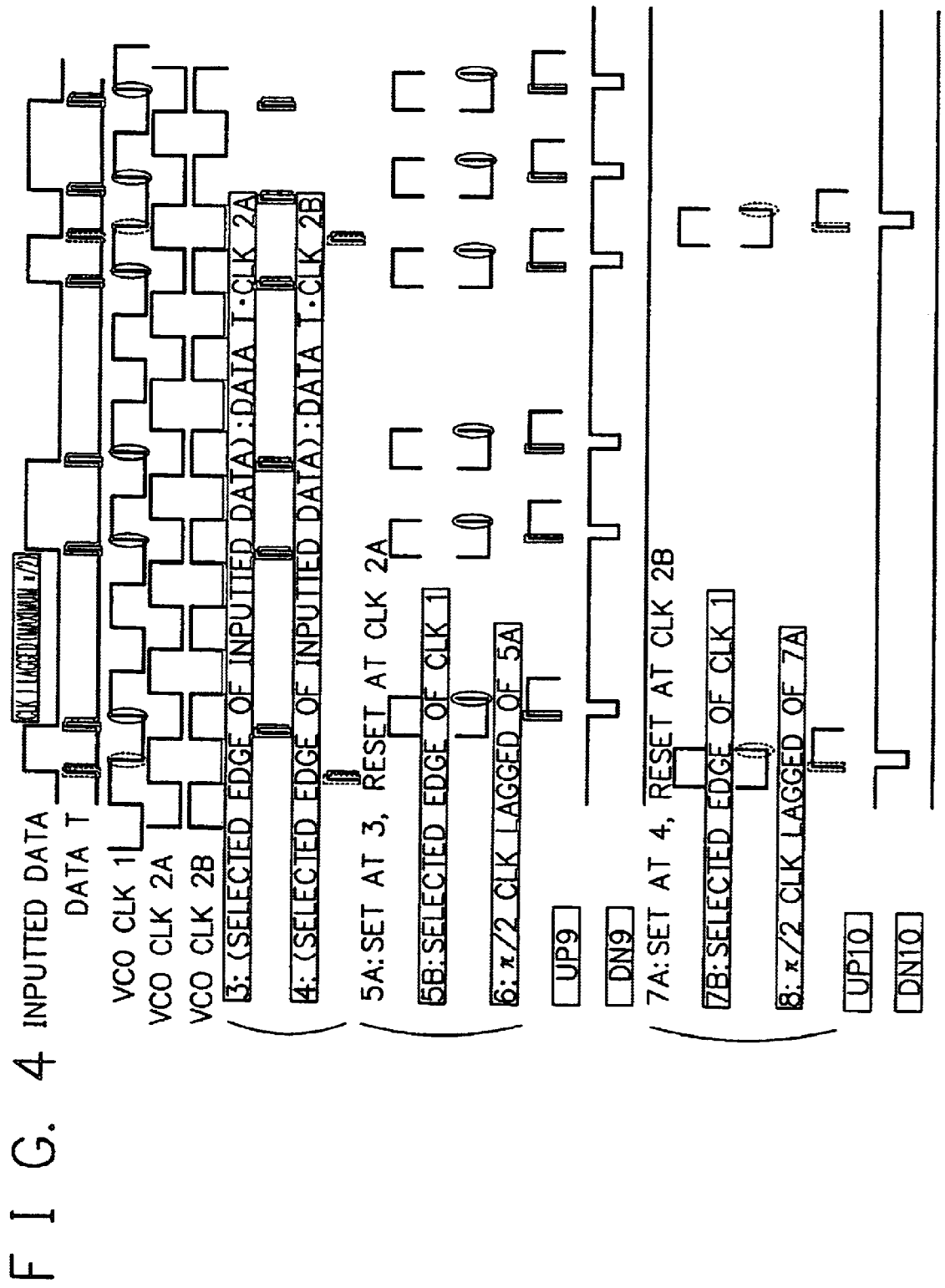
FIG. 4 is a timing chart of output signals in case that the phase of a reference clock signal CLK 1 lagged by maximum π/2 phase for inputted serial random data.
Figure 5:
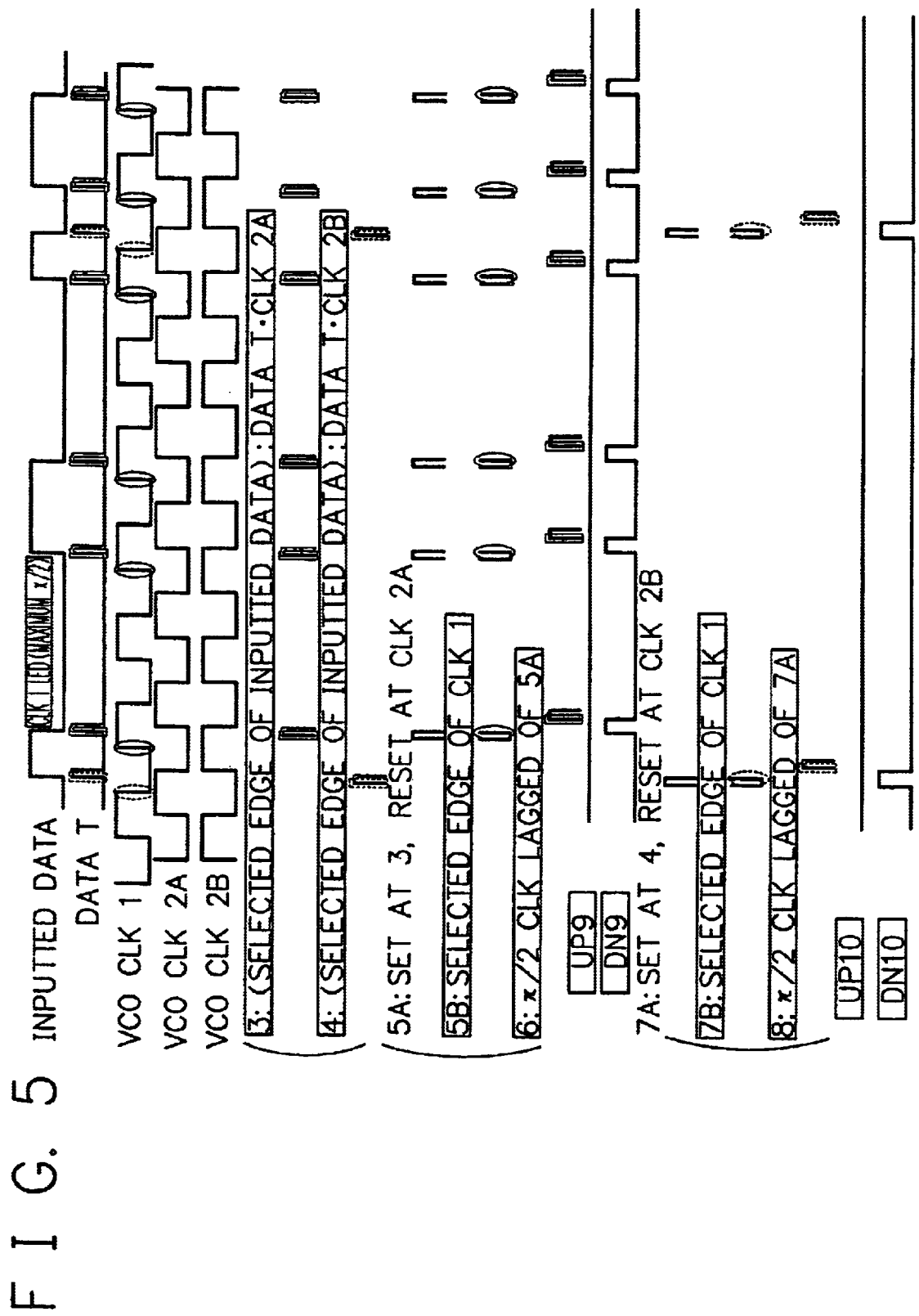
FIG. 5 is a timing chart of output signals in case that the phase of the CLK 1 led by maximum π/2 phase for the inputted serial random data.
Figure 6:
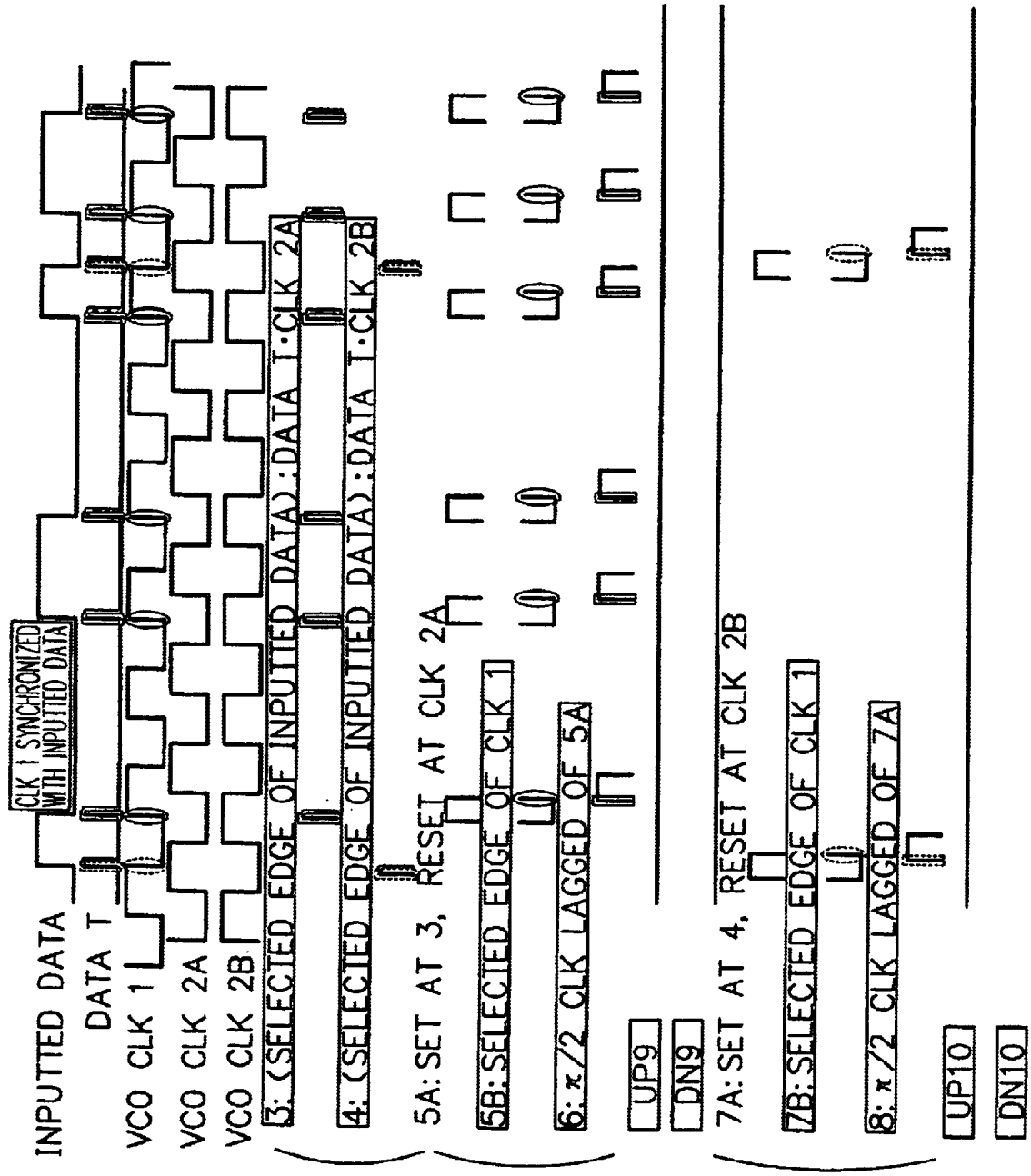
FIG. 6 is a timing chart of output signals in case that the phase of the inputted serial random data is synchronized with the phase of the CLK 1.

Next, referring to FIGS. 4 to 6, operation of the clock recovery circuit of the present invention is explained. FIG. 4 is a timing chart of output signals in case that the phase of the CLK 1 lagged by maximum π/2 phase for the inputted serial random data. FIG. 5 is a timing chart of output signals in case that the phase of the CLK 1 led by maximum π/2 phase for the inputted serial random data. FIG. 6 is a timing chart of output signals in case that the phase of the inputted serial random data is synchronized with the phase of the CLK 1.

First, the edge detecting circuit 30 generates edge pulses DATA T by detecting rising edges and falling edges for the inputted serial random data.

Actually, the edge detecting circuit 30 detects the rising edges and the falling edges of the inputted serial random data by inputting the serial random data and the lagged pulses of the inputted serial random data at the delay circuit 38 to the EX-OR circuit 39. The detected edges of the inputted serial random data are inputted to the detected edge selecting circuit 31 as edge pulses named DATA T.

Next, the edge pulses DATA T detected at the edge detecting circuit 30 are inputted to each one terminal of the AND circuits 40 and 41 in the detected edge selecting circuit 31. And it is selected whether the edge pulses DATA T are compared with the phase of the rising edges or the falling edges of the reference clock signal CLK 1.

The clock pulse CLK 2A lagged by $\pi/2$ phase for the CLK 1 is inputted to the other terminal of the AND circuit 40. And the clock pulse CLK 2B led by $\pi/2$ phase for the CLK 1 is inputted to the other terminal of the AND circuit 41. And it is judged that the edges (pulses 3) of the edge pulses DATA T obtained at the AND circuit 40 with the CLK 2A are compared with the phase of the falling edges of the CLK 1, and that the edges (pulses 4) of the edge pulses DATA T obtained at the AND circuit 41 with the CLK 2B are compared with the phase of the rising edges of the CLK 1.

The phases of the pulses 3 and 4 having phase information of the inputted serial random data and the phase of the selected edges of the CLK 1 are compared. At this time, the PFDs 33 and 34, which output pulses having the pulse width proportioned to the phase difference between two pulses to be compared their phases, are used. In this, frequencies (the number of rising edges of pulses) of the two pulses to be compared must be the same. The reason to use a PFD is that the PFD can output pulses having the pulse width proportioned to the phase difference of two pulses to be compared their phases. That is, when the phases of two pulses are synchronized, the phase difference signal is not outputted, and a current to charge or discharge the charge pump does not exist, and the jitter characteristic at the synchronized state is improved.

Therefore, the edge position correcting circuit for comparing edges 32 makes the number of edges of the pulses outputted from the detected edge selecting circuit 31 equal to the number of edges of the CLK 1 to be compared their phases, and corrects the phase errors added to the original phase difference at this process.

Actually, by using the SR-F/F 42, the pulses 3 of the selected inputted serial random data and the edges of the CLK 2A to be compared their phase are only selected, and the number of edges of both signals to be compared their phases is made to be the same. And by using the SR-F/F 43, the pulses 4 of the selected inputted serial random data and the edges of the CLK 2B to be compared their phase are only selected, and the number of edges of both signals to be compared their phases is made to be the same.

In fact, the pulses 3 outputted from the AND circuit 40 are inputted to the SR-F/F 42 as set inputs, and the clock pulse CLK 2A is inputted to the SR-F/F 42 as a reset input, and pulses 5A and inverted output pulses 5B are generated as shown in FIGS. 4 to 6. And the pulses 4 outputted from the AND circuit 41 are inputted to the SR-F/F 43 as set inputs, and the clock pulse CLK 2B is inputted to the SR-F/F 43 as a reset input, and pulses 7A and inverted output pulses 7B are generated as shown in FIGS. 4 to 6.

The rising edges of the pulses 5A show the positions of selected edges of the inputted serial random data, and the rising edges of the pulses 5B show the positions of the rising edges of the CLK 2A using for the phase comparison as shown in FIGS. 4 to 6. And the rising edges of the pulses 7A show the positions of selected edges of the inputted serial random data, and the rising edges of the pulses 7B show the positions of the rising edges of the CLK 2B using for the phase comparison as shown in FIGS. 4 to 6.

However, the phase comparison is actually desired to perform between the rising and falling edges of the CLK 1 and the selected edges of the inputted serial random data. Therefore, based on that the phase of the rising edges of the CLK 2A lags by $\pi/2$ for the phase of the rising edge of the CLK 1, the $\pi/2$ CLK delay circuit 44 generates the pulses 6 that the pulses 5A are made to lag by $\pi/2$. The rising edges of the pulses 6 are that the phases of the selected edges of the inputted serial random data are made to lag by $\pi/2$. Therefore, it becomes possible to compare the phases between the selected edges of the inputted serial random data and the rising edges of the CLK 1 by comparing the phases of the rising edges of the pulses 6 with the phases of the rising edges of the pulses 5B. The same as above, based on that the phase of the rising edges of the CLK 2B lags by $\pi/2$ for the phase of the falling edges of the CLK 1, the $\pi/2$ CLK delay circuit 45 generates the pulses 8 that the pulses 7A are made to lag by $\pi/2$. The rising edges of the pulses 8 are that the phases of the selected edges of the inputted serial random data are made to lag by $\pi/2$. Therefore, it becomes possible to compare the phases between the selected edges of the inputted serial random data and the falling edges of the CLK 1 by comparing the phases of the rising edges of the pulses 8 with the phases of the rising edges of the pulses 7B.

The phase comparison is performed by inputting the pulses 5B having the position information of the rising edges of the CLK 1 and the pulses 6 having the position information of the selected edges of the inputted serial random data to the PFD 33. The UP and DOWN pulses obtained by this process are shown in FIGS. 4 to 6 as UP 9 and DN 9 respectively.

The same as above, the phase comparison is performed by inputting the pulses 7B having the position information of the falling edge of the CLK 1 and the pulses 8 having the position information of the selected edges of the inputted serial random data to the PFD 34. The UP and DOWN pulses obtained by this process are shown in FIGS. 4 to 6 as UP 10 and DN 10 respectively.

As shown in FIG. 4, when the phase of the CLK 1 lagged (maximum $\pi/2$) for the inputted serial random data, the UP signals UP 9 and UP 10 in response to this lag are outputted and the DOWN signals DN 9 and DN 10 are not outputted, therefore, a current flowing through the CP 35 does not exist.

And as shown in FIG. 5, when the phase of the CLK 1 led (maximum $\pi/2$) for the inputted serial random data, on the contrary, in response to that the phase of the CLK 1 led for the inputted serial random data, the DOWN signals DN 9 and DN 10 are outputted but the UP signals UP 9 and UP 10 are not outputted. Therefore, a current flowing through the CP 35 does not exist.

And as shown in FIG. 6, when the phase of the CLK 1 synchronized with the phase of the inputted serial random data, both the UP signals UP 9 and UP 10 and the DOWN signals DN 9 and DN 10 are not outputted. Therefore, a current flowing through the CP 35 does not exist.

As mentioned above, at the first embodiment of the present invention, the clock recovery can be performed by using the f/2 Hz clock signal being a half of the data rate "f" bps of the inputted serial random data. Therefore, at the present invention, it is possible to make the data rate be twice by using the conventional VCO.

And at the clock recovery circuit of the first embodiment of the present invention, a PFD, in which a pulse width proportioned to the phase difference can be directly obtained, is used. Therefore, at the normal operation being synchronized operation, a current flowing through a CP does not exist, and the jitter characteristic can be improved.

Figure 7:
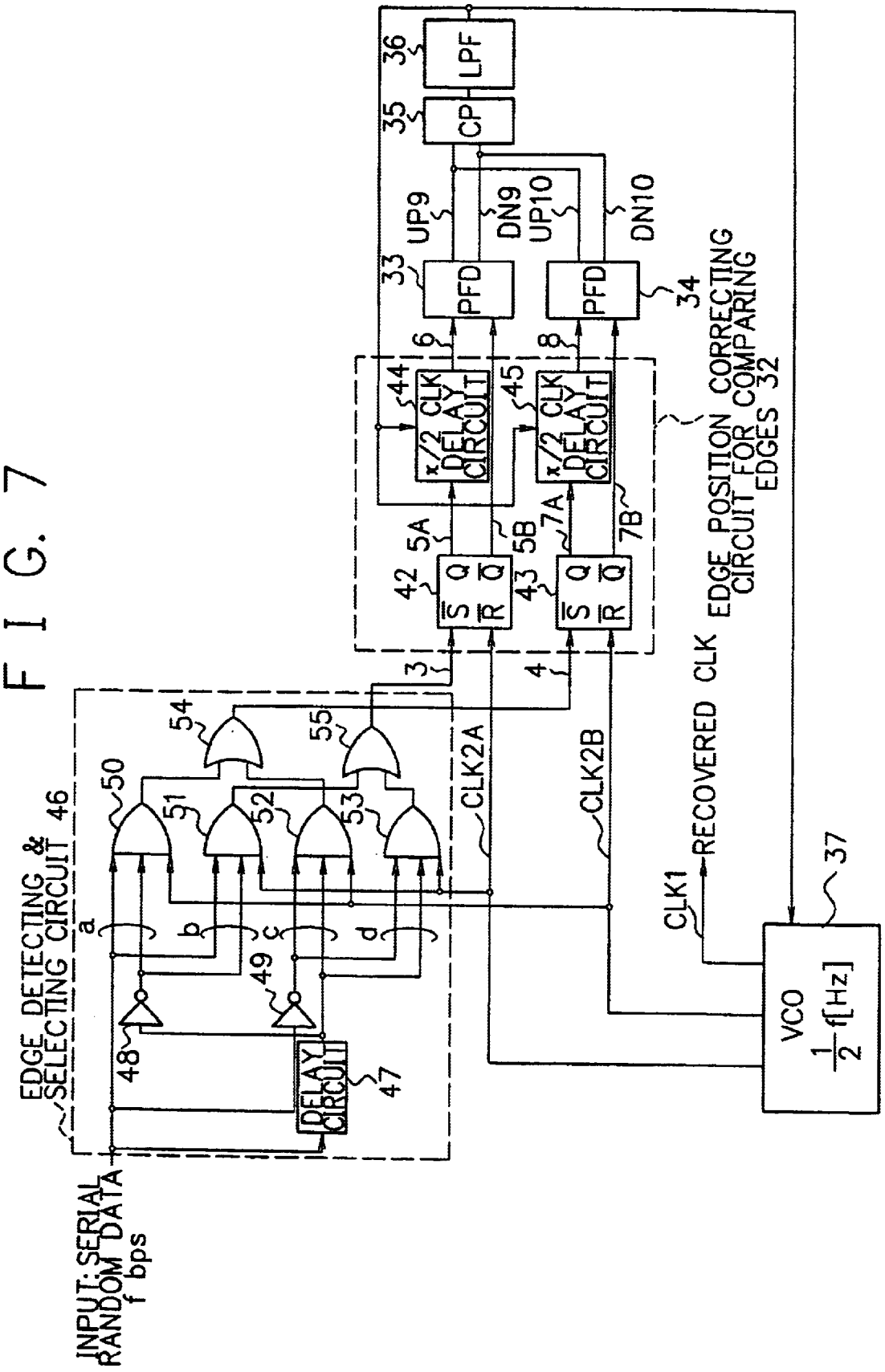
FIG. 7 is a block diagram showing a second embodiment of the clock recovery circuit of the present invention.

Next, referring to FIG. 7, a second embodiment of the clock recovery circuit of the present invention is explained.

FIG. 7 is a block diagram showing the second embodiment of the clock recovery circuit of the present invention. The same functions and pulses at the second embodiment that the first embodiment uses have the same reference numbers.

At the first embodiment, the edge detecting circuit 30 shown in FIG. 3 generates the rising edges and the falling edges of the inputted serial random data at the same time. And after this, the detected edge selecting circuit 31 selects whether the edge pulses DATA T are compared with the rising edges or the falling edges of the CLK 1. However, as mentioned above, the edge detecting circuit 30 detects the rising edges and the falling edges of the inputted serial random data being high speed at the same time, therefore, the load for the edge detecting circuit 30 becomes large, and its operating speed may be caused to slow.

In order to solve this, at the second embodiment, an edge detecting and selecting circuit 46 is provided in the clock recovery circuit instead of the edge detecting circuit 30 and the detected edge selecting circuit 31 in the first embodiment.

The edge detecting and selecting circuit 46 consists of a delay circuit 47 which makes the inputted serial random data lag, an inverter 48 which inverts outputs from the delay circuit 47, an inverter 49 which inverts the inputted serial random data, an AND circuit 50, to which the inputted serial random data, pulses outputted from the inverter 48, and the CLK 2B led by $\pi/2$ phase for the CLK 1 outputted from the VCO 37, are inputted, an AND circuit 51, to which the inputted serial random data, the pulses outputted from the inverter 48, and the CLK 2A lagged by $\pi/2$ phase for the CLK 1 outputted from the VCO 37, are inputted, an AND circuit 52, to which pulses outputted from the inverter 49, pulses outputted from the delay circuit 47, and the CLK 2B outputted from the VCO 37, are inputted, an AND circuit 53, to which the pulses outputted from the inverter 49, the pulses outputted from the delay circuit 47, and the CLK 2A outputted from the VCO 37, are inputted, an OR circuit 54, to which pulses outputted from the AND circuit 50 and pulses outputted from the AND circuit 52, are inputted, and an OR circuit 55, to which pulses outputted from the AND circuit 51 and pulses outputted from the AND circuit 53 are inputted.

The AND circuits 50 and 51 detect the rising edges of the inputted serial random data by applying AND for the inputted serial random data and the pluses which are made to lag at the delay circuit 47 and inverted at the inverter 48. And the AND circuits 52 and 53 detect the falling edges of the inputted serial random data by applying AND for the inputted serial random data inverted at the inverter 49 and the pluses delayed at the delay circuit 47. And the CLK 2B is inputted to the AND circuits 50 and 52, therefore, the AND circuits 50 and 52 detect the edges of the inputted serial random data using for comparing phases with the rising edges of the CLK 1. And the CLK 2A is inputted to the AND circuits 51 and 53, therefore, the AND circuits 51 and 53 detect the edges of the inputted serial random data using for comparing phases with the falling edges of the CLK 1.

With this structure, two routes can be provided. That is, the rising edges of the inputted serial random data are detected at one route (a and c in FIG. 7), and the falling edges of the inputted serial random data are detected at the other route (b and d in FIG. 7). As a result, the load for the each circuit is reduced to about half of the first embodiment, and the operating speed can be improved to almost two times.

Figure 8:
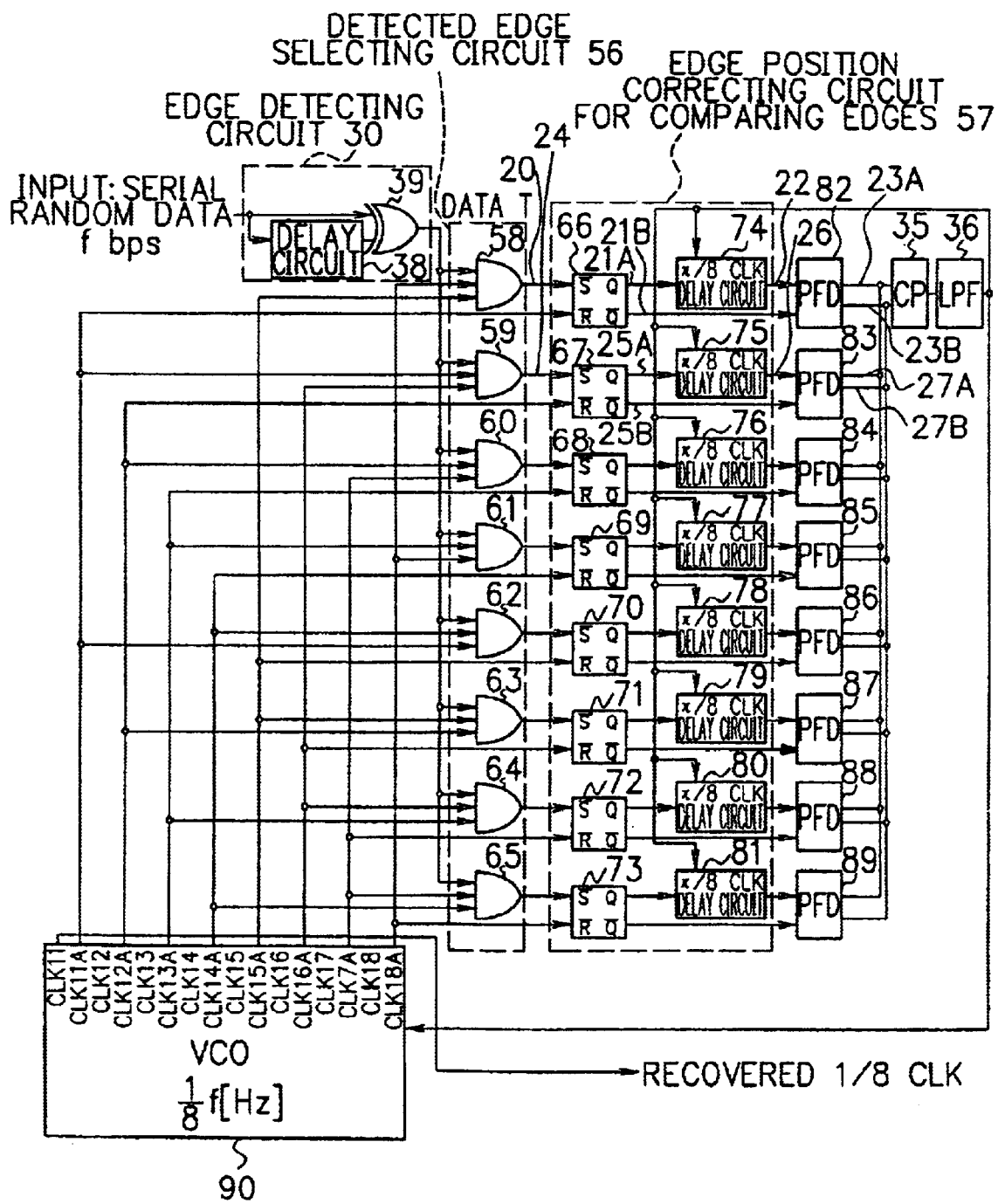
FIG. 8 is a block diagram showing a third embodiment of the clock recovery circuit of the present invention.

Next, referring to FIGS. 8 and 9, a third embodiment of the clock recovery circuit of the present invention is explained. FIG. 8 is a block diagram showing the third embodiment of the clock recovery circuit of the present invention. FIG. 9 is a timing chart of signals outputted from functions shown in FIG. 8. The same functions and pulses at the third embodiment that the first embodiment uses have the same reference numbers.

As shown in FIG. 8, the third embodiment of the clock recovery circuit of the present invention consists of an edge detecting circuit 30, a detected edge selecting circuit 56, an edge position correcting circuit for comparing edges 57, PFDs 82, 83, 84, 85, 86, 87, 88, and 89, a CP 35, a LPF 36, and a VCO 90. The VCO 90 oscillates at about f/8 Hz being $\frac{1}{8}$ frequency of the data rate of the inputted serial random data. And the VCO 90 supplies 8 reference clock signals and 8 clock pulses. That is, the 8 reference clock signals are CLK 11, CLK 12, CLK 13, CLK 14, CLK 15, CLK 16, CLK 17, and CLK 18 whose phases are shifted by $\pi/4$ one another, and 8 clock pulses are CLK 11A, CLK 12A, CLK 13A, CLK 14A, CLK 15A, CLK 16A, CLK 17A, and CLK 18A whose phases are shifted by $\pi/8$ from each of the reference clock signals. By using these reference clock signals and clock pulses, the edge detection and selection of the detected edges are performed. In this, the phases of $\pi/4$ and $\pi/8$ are based on one cycle $2\pi$ of the reference clock signal oscillated by the VCO 90.

The detected edge selecting circuit 56 consists of an AND circuit 58 which applies AND to the edge pulses detected at the edge detecting circuit 30, the CLK 15A lagged by $\pi/8$ phase for the CLK 15, and the CLK 18A lagged by $\pi/8$ phase for the CLK 18, an AND circuit 59 which applies AND to the edge pulses detected at the edge detecting circuit 30, the CLK 11A lagged by $\pi/8$ phase for the CLK 11, and the CLK 16A lagged by $\pi/8$ phase for the CLK 16, an AND circuit 60 which applies AND to the edge pulses detected at the edge detecting circuit 30, the CLK 12A lagged by $\pi/8$ phase for the CLK 12, and the CLK 17A lagged by $\pi/8$ phase for the CLK 17, an AND circuit 61 which applies AND to the edge pulses detected at the edge detecting circuit 30, the CLK 13A lagged by $\pi/8$ phase for the CLK 13, and the CLK 18A lagged by $\pi/8$ phase for the CLK 18, an AND circuit 62 which applies AND to the edge pulses detected at the edge detecting circuit 30, the CLK 14A lagged by $\pi/8$ phase for the CLK 14, and the CLK 11A lagged by $\pi/8$ phase for the CLK 11, an AND circuit 63 which applies AND to the edge pulses detected at the edge detecting circuit 30, the CLK 15A lagged by $\pi/8$ phase for the CLK 15, and the CLK 12A lagged by $\pi/8$ phase for the CLK 12, an AND circuit 64 which applies AND to the edge pulses detected at the edge detecting circuit 30, the CLK 16A lagged by $\pi/8$ phase for the CLK 16, and the CLK 13A lagged by $\pi/8$ phase for the CLK 13, and an AND circuit 65 which applies AND to the edge pulses detected at the edge detecting circuit 30, the CLK 17A lagged by $\pi/8$ phase for the CLK 17, and the CLK 14A lagged by $\pi/8$ phase for the CLK 14.

The edge position correcting circuit for comparing edges 57 consists of SR-F/Fs 66, 67, 68, 69, 70, 71, 72, and 73, and $\pi/8$ CLK delay circuits 74, 75, 76, 77, 78, 79, 80, and 81.

Pulses outputted from the AND circuit 58 and the CLK 11A are inputted to set and reset terminals of the SR-F/F 66 respectively. Pulses outputted from the AND circuit 59 and the CLK 12A are inputted to set and reset terminals of the SR-F/F 67 respectively. Pulses outputted from the AND circuit 60 and the CLK 13A are inputted to set and reset terminals of the SR-F/F 68 respectively. Pulses outputted from the AND circuit 61 and the CLK 14A are inputted to set and reset terminals of the SR-F/F 69 respectively. Pulses outputted from the AND circuit 62 and the CLK 15A are inputted to set and reset terminals of the SR-F/F 70 respectively. Pulses outputted from the AND circuit 63 and the CLK 16A are inputted to set and reset terminals of the SR-F/F 71 respectively. Pulses outputted from the AND circuit 64 and the CLK 17A are inputted to set and reset terminals of the SR-F/F 72 respectively. Pulses outputted from the AND circuit 65 and the CLK 18A are inputted to set and reset terminals of the SR-F/F 73 respectively.

The $\pi/8$ CLK delay circuit 74 makes pulses outputted from the SR-F/F 66 lag by $\pi/8$, by inputting an output from the LPF 36 and outputs from the SR-F/F 66. The $\pi/8$ CLK delay circuit 75 makes pulses outputted from the SR-F/F 67 lag by $\pi/8$, by inputting the output from the LPF 36 and outputs from the SR-F/F 67. The $\pi/8$ CLK delay circuit 76 makes pulses outputted from the SR-F/F 68 lag by $\pi/8$, by inputting the output from the LPF 36 and outputs from the SR-F/F 68. The $\pi/8$ CLK delay circuit 77 makes pulses outputted from the SR-F/F 69 lag by $\pi/8$, by inputting the output from the LPF 36 and outputs from the SR-F/F 69. The $\pi/8$ CLK delay circuit 78 makes pulses outputted from the SR-F/F 70 lag by $\pi/8$, by inputting the output from the LPF 36 and the outputs from the SR-F/F 70. The $\pi/8$ CLK delay circuit 79 makes pulses outputted from the SR-F/F 71 lag by $\pi/8$, by inputting the output from the LPF 36 and outputs from the SR-F/F 71. The $\pi/8$ CLK delay circuit 80 makes pulses outputted from the SR-F/F 72 lag by $\pi/8$, by inputting the output from the LPF 36 and outputs from the SR-F/F 72. The $\pi/8$ CLK delay circuit 81 makes pulses outputted from the SR-F/F 73 lag by $\pi/8$, by inputting the output from the LPF 36 and outputs from the SR-F/F 73.

The PFD 82 compares the phases of the pulses made the outputs from the SR-F/F 66 lag by $\pi/8$ at the $\pi/8$ CLK delay circuit 74 with the phase of the inverted output pulses of the SR-F/F 66. The PFD 83 compares the phases of the pulses made the outputs from the SR-F/F 67 lag by $\pi/8$ at the $\pi/8$ CLK delay circuit 75 with the phase of the inverted output pulses of the SR-F/F 67. The PFD 84 compares the phases of the pulses made the outputs from the SR-F/F 68 lag by $\pi/8$ at the $\pi/8$ CLK delay circuit 76 with the phase of the inverted output pulses of the SR-F/F 68. The PFD 85 compares the phases of the pulses made the outputs from the SR-F/F 69 lag by $\pi/8$ at the $\pi/8$ CLK delay circuit 77 with the phase of the inverted output pulses of the SR-F/F 69. The PFD 86 compares the phases of the pulses made the outputs from the SR-F/F 70 lag by $\pi/8$ at the $\pi/8$ CLK delay circuit 78 with the phase of the inverted output pulses of the SR-F/F 70. The PFD 87 compares the phases of the pulses made the outputs from the SR-F/F 71 lag by $\pi/8$ at the $\pi/8$ CLK delay circuit 79 with the phase of the inverted output pulses of the SR-F/F 71. The PFD 88 compares the phases of the pulses made the outputs from the SR-F/F 72 lag by $\pi/8$ at the $\pi/8$ CLK delay circuit 80 with the phase of the inverted output pulses of the SR-F/F 72. The PFD 89 compares the phases of the pulses made the outputs from the SR-F/F 73 lag by $\pi/8$ at the $\pi/8$ CLK delay circuit 81 with the phase of the inverted output pulses of the SR-F/F 73.

Referring to FIG. 9, an operation of the third embodiment of the present invention is explained.

The detected edge selecting circuit 56 judges that the phases of the edge pulses detected at the edge detecting circuit 30 are compared with the phase of any edges of the 8 reference clock signals (CLK 11, CLK 12, CLK 13, CLK 14, CLK 15, CLK 16, CLK 17, and CLK 18 in FIG. 9) outputted from the VCO 90, by using the 8 clock pulses led by $\pi/8$ phase (CLK 18A, CLK 11A, CLK 12A, CLK 13A, CLK 14A, CLK 15A, CLK 16A, and CLK 17A in FIG. 9) for the 8 reference clock signals and the 8 clock pulses lagged by $\pi/8$ phase (CLK 11A, CLK 12A, CLK 13A, CLK 14A, CLK 15A, CLK 16A, CLK 17A, and CLK 18A in FIG. 9) for the 8 reference clock signals.

The edge detecting circuit 30 detects rising edges and falling edges of the inputted serial random data and generates edge pulses DATA T. This operation is the same at the first embodiment.

At the third embodiment of the present invention, for example, as shown at the left upper part of FIG. 9, at the places where the rising edges of the CLK 11 have a phase lag (less than $\pi/8$) for the rising edges of the inputted data, by applying AND for the edge pulses DATA T, the CLK 18A, and the CLK 15A, a pulse (20 in FIGS. 8 and 9) whose phase must be compared with the phase of the rising edge of the CLK 11 is generated. In this, the CLK 18A and the CLK 15A are used for detecting the edge, because the phase difference between the CLK 18A and the CLK 15A corresponds to the width of one bit of the data. As shown in FIG. 9, the rising edge of the CLK 11 is between the rising edge of the CLK 18A and the falling edge of the CLK 15A. In the edge pulses detected at the edge detecting circuit 30, a pulse whose phase must be compared with the rising edge of the CLK 11 is between the rising edge of the CLK 18A and the falling edge of the CLK 15A.

And the pulse 20 outputted from the AND circuit 58 is inputted to the set terminal of the SR-F/F 66, and the CLK 11A is inputted to the reset terminal of the SR-F/F 66. Then, a pulse 21 A and an inverted pulse 21 B are generated at the SR-F/F 66 as shown in FIGS. 8 and 9. With this operation, the number of the selected edges of the inputted data and the number of the edges of the CLK 11A to be compared their phases become the same.

As shown in FIG. 9, the rising edge of the pulse 21A outputted from the SR-F/F 66 shows the position of the selected edge of the inputted serial random data, and the rising edge of the pulse 21B outputted from the SR-F/F 66 shows the position of the rising edge of the CLK 11A using for the phase comparison.

However, the phase comparison is actually desired to perform between the rising edges of the CLK 11 and the selected edges of the inputted serial random data. Therefore, based on that the phase of the rising edges of the CLK 11A lags by $\pi/8$ for the phase of the rising edge of the CLK 11, the $\pi/8$ CLK delay circuit 74 generates a pulse 22 that the pulse 21A is made to lag by $\pi/8$. The rising edge of the pulse 22 is that the phase of the selected edge of the inputted serial random data is made to lag by $\pi/8$. Therefore, it becomes possible to compare the phase between the selected edges of the inputted serial random data and the rising edges of the CLK 11 by comparing the phase of the rising edges of the pulse 22 with the phase of the rising edges of the pulse 21B.

The phase comparison is performed by inputting the pulse 21B having the position information of the rising edge of the CLK 11A and the pulse 22 having the position information of the selected edges of the inputted serial random data to the PFD 82. The UP and DOWN pulses obtained by this process are shown in FIG. 9 as UP 23A and DN 23B respectively.

As the same as mentioned above, the selection of the detected edges and edge position correction for comparing edges are performed for the edge pulse DATA T corresponding to each edge of the inputted serial random data. At the third embodiment shown in FIGS. 8 and 9, the CLK 11A and the CLK 16A are used for selecting edges of the edge pulses whose phases are compared with the CLK 12, the CLK 12A and the CLK 17A are used for selecting edges of the edge pulses whose phases are compared with the CLK 13, the CLK 13A and the CLK 18A are used for selecting edges of the edge pulses whose phases are compared with the CLK 14, the CLK 11A and the CLK 14A are used for selecting edges of the edge pulses whose phases are compared with the CLK 15, the CLK 12A and the CLK 15A are used for selecting edges of the edge pulses whose phases are compared with the CLK 16, the CLK 13A and the CLK 16A are used for selecting edges of the edge pulses whose phases are compared with the CLK 17, and the CLK 14A and the CLK 17A are used for selecting edges of the edge pulses whose phases are compared with the CLK 18.

As mentioned above, the phase comparison between the edges of the detected edge pulses DATA T and the 8 reference clock signals (CLK 11, CLK 12, CLK 13, CLK 14, CLK 15, CLK 16, CLK 17, and CLK 18 in FIG. 9) outputted from the VCO 90 is performed by using the 8 clock pulses led by $\pi/8$ phase (CLK 18A, CLK 11A, CLK 12A, CLK 13A, CLK 14A, CLK 15A, CLK 16A, and CLK 17A in FIG. 9) for the 8 reference clock signals and the 8 clock pulses lagged by $\pi/8$ phase (CLK 11A, CLK 12A, CLK 13A, CLK 14A, CLK 15A, CLK 16A, CLK 17A, and CLK 18A in FIG. 9) for the 8 reference clock signals. Therefore, the clock recovery can be performed by using the f/8 Hz reference clock signal being one eighth of the data rate "f" bps of the inputted serial random data.

At the third embodiment, as the same as the first and second embodiments, the current flowing through the CP can be reduced to "0" theoretically, therefore the jitter characteristic at the synchronized state of the clock recovery circuit can be improved.

As mentioned above, the clock recovery circuit of the present invention can realize the clock recovery by using $1/\pi$ frequency of the data rate of the inputted serial random data. Therefore, high speed recovery of clocks can be obtained without any limitation of the oscillating frequency of the VCO.

Moreover, the clock recovery circuit of the present invention provides PFDs which can compare phases by using a reference clock signal being 1/n frequency of the data rate of the inputted serial random data. Therefore, when the clock recovery circuit is synchronized, the current flowing through the CP can be made to "0", and the jitter characteristic at the time when the clock recovery circuit is synchronized can be improved.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What is claimed is:

1. A clock recovery circuit, comprising:
   multi phase clock signal generating means which generates a reference clock signal whose frequency is controlled to be about f/2 Hz for inputted serial random data whose data rate is "f" bit per second (bps), and also generates a plurality of clock pulses whose phases are different from said reference clock signal;
   edge detecting means for detecting rising edges and falling edges of said inputted serial random data;
   detected edge selecting means which selects whether said detected edges of said inputted serial random data are compared their phases with rising edges or falling edges of said reference clock signal, and outputs first edge pulses synchronized with edges which are judged to be compared their phases with said rising edges of said reference clock signal and second edge pulses synchronized with edges which are judged to be compared their phases with said falling edges of said reference clock signal;
   first edge position correction for comparing edges means which corrects so that the frequency of a first clock pulse becomes equal to the frequency of said first edge pulses by selecting only edges of said first clock pulses which perform phase comparison with said first edge pulses in the edges of said first clock pulses which are used at the phase comparison with the rising edges of said reference clock signal, and also makes edges of said first edge pulses lag by phase difference between said reference clock signal and said first clock pulse;
   second edge position correction for comparing edges means which corrects so that the frequency of a second clock pulse becomes equal to the frequency of said second edge pulses by selecting only edges of said second clock pulses which perform phase comparison with the falling edges of said reference clock signal, and also makes edges of said second edge pulses lag by phase difference between said reference clock signal and said second clock pulse;
   first phase frequency detecting means which compares phases between said first clock pulse whose frequency is equal to the frequency of said first edge pulses, outputted from said first edge position correction for comparing edges means, and said first edge pulses whose phases are made to lag by said phase difference, and outputs pulses of the pulse widths in proportion to said phase difference between both compared pulses; and
   second phase frequency detecting means which compares phases between said second clock pulse whose frequency is equal to the frequency of said second edge pulses, outputted from said second edge position correction for comparing edges means, and said first edge pulses whose phases are made to lag by said phase difference, and outputs pulses of the pulse widths in proportion to said phase difference between the both compared inputted serial random data pulses and reference clock signal pulses.

2. A clock recovery circuit in accordance with claim 1, wherein:
   said plurality of clock pulses whose phases are different from said reference clock signal whose cycle is $2\pi$ is composed of a first clock pulse whose phase lags by $\pi/2$ for said reference clock signal and a second clock pulse whose phase leads by $\pi/2$ for said reference clock signal;
   said edge detecting means comprises a delay circuit which makes the phase of said inputted serial random data lag, and an exclusive-or (EX-OR) circuit to which said inputted serial random data and pulses that said inputted serial random data are made to lag at said delay circuit are inputted;
   said detected edge selecting means comprises a first AND circuit to which edge pulses being synchronized with rising edges and falling edges of said inputted serial random data outputted from said EX-OR circuit and said first clock pulse are inputted, and a second AND circuit to which edge pulses being synchronized with rising edges and falling edges of said inputted serial random data outputted from said EX-OR circuit and said second clock pulse are inputted;
   said first edge position correction for comparing edges means comprises a first set-reset flip flop (SR-F/F)

whose set terminal pulses outputted from said first AND circuit are inputted to and whose reset terminal said first clock pulse is inputted to, and a first delay circuit which makes said pulses outputted from said first SR-F/F lag by π/2 phase;

said second edge position correction for comparing edges means comprises a second SR-F/F whose set terminal pulses outputted from said second AND circuit are inputted to and whose reset terminal said second clock pulse is inputted to, and a second delay circuit which makes said pulses outputted from said second SR-F/F lag by π/2 phase;

said first phase frequency detecting (PFD) means compares phases between pulses outputted from said first delay circuit and an inverted output pulse from said first SR-F/F; and said second PFD means compares phases between pulses outputted from said second delay circuit and an inverted output pulse from said second SR-F/F.

3. A clock recovery circuit in accordance with claim 1, wherein:

said plurality of clock pulses whose phases are different from said reference clock signal whose cycle is 2π is composed of a first clock pulse whose phase lags by π/2 for said reference clock signal and a second clock pulse whose phase leads by π/2 for said reference clock signal;

said edge detecting means and said detected edge selecting means comprises a first AND circuit to which said inputted serial random data, and pulses made to lag and inverted said inputted serial random data, and said second clock pulse are inputted, and a second AND circuit to which said inputted serial random data, and pulses made to lag and inverted said inputted serial random data, and said first clock pulse are inputted, and a third AND circuit to which inverted said inputted serial random data, and pulses made to lag said inputted serial random data, and said second clock pulse are inputted, and a fourth AND circuit to which inverted said inputted serial random data, and pulses made to lag said inputted serial random data, and said first clock pulse are inputted, and a first OR circuit to which outputs from said first and third AND circuits are inputted, and a second OR circuit to which outputs from said second and fourth AND circuits are inputted;

said first edge position correction for comparing edges means comprises a first SR-F/F whose set terminal pulses outputted from said second OR circuit are inputted to and whose reset terminal said first clock pulse is inputted to, and a first delay circuit which makes said pulses outputted from said first SR-F/F lag by π/2 phase;

said second edge position correction for comparing edges means comprises a second SR-F/F whose set terminal pulses outputted from said first OR circuit are inputted to and whose reset terminal said second clock pulse is inputted to, and a second delay circuit which makes said pulses outputted from said second SR-F/F lag by π/2 phase;

said first PFD means compares phases between pulses outputted from said first delay circuit and an inverted output pulse from said first SR-F/F;

and said second PFD means compares phases between pulses outputted from said second delay circuit and an inverted output pulse from said second SR-F/F.

4. A clock recovery circuit, comprising:

multi phase clock signal generating means which generates a plurality of reference clock signals whose phases are serially different respectively and whose frequency is controlled to be about f/n Hz (n is an integer) for inputted serial random data whose data rate is "f" bit per second (bps), and also generates a plurality of clock pulses whose phases are different from said plurality of reference clock signals by a designated value respectively;

edge detecting means which detects rising edges and falling edges of said inputted serial random data and generates edge pulses synchronized with said rising and falling edges;

detected edge selecting means which selects that said detected edges of said inputted serial random data at said edge detecting means are compared their phases with any of said reference clock signals generated at said multi phase clock generating means, and outputs edge pulses synchronized with selected edges of said inputted serial random data in each of said reference clock signals;

edge position correction for comparing edges means which corrects so that the frequency of said clock pulses becomes equal to the frequency of edge pulses by selecting only edges using for phase comparison with said edge pulses in the edges of said clock pulses set each of said reference clock signals which are used at the phase comparison with edge pulses generated each of said reference clock signals, and also makes edges of said edge pulses lag by phase difference between said reference clock signals and said clock pulses set each of said reference clock signals; and phase frequency detecting means which compares phases between said clock pulses whose frequency is equal to the frequency of said edge pulses, outputted from said edge position correction for comparing edges means, and said edge pulses whose phases are made to lag by said phase difference, and outputs pulses widths in proportion to the phase difference between said both compared inputted serial random data pulses and reference clock signal pulses.

5. A clock recovery circuit in accordance with claim 4, wherein:

said reference clock signals whose cycle is 2π are composed of eight clock signals shifted by π/4 phase respectively, and said clock pulses are composed of eight clock pulses lagged by π/8 phase for each of said reference clock signals;

said edge detecting means comprises a delay circuit which makes the phase of said inputted serial random data lag, and an exclusive-or (EX-OR) circuit to which said inputted serial random data and pulses that said inputted serial random data are made to lag at said delay circuit are inputted; and said clock recovery circuit, further comprising:

a first AND circuit which applies AND to said edge pulses, a fifth clock pulse lagged by π/8 phase for a fifth reference clock signal lagged by iπ phase for a first reference clock signal, and an eighth clock pulse lagged by π/8 phase for an eighth reference clock signal lagged by 7π/4 phase for said first reference clock signal;

a second AND circuit which applies AND to said edge pulses, a first clock pulse lagged by π/8 phase for said first reference clock signal, and a sixth clock pulse lagged by π/8 phase for a sixth reference clock signal lagged by 5π/4 phase for said first reference clock signal;

a third AND circuit which applies AND to said edge pulses, a second clock pulse lagged by π/8 phase for a second reference clock signal lagged by π/4 phase for said first reference clock signal, and a seventh clock pulse lagged by π/8 phase for a seventh reference clock signal lagged by 3π/2 phase for said first reference clock signal;

a fourth AND circuit which applies AND to said edge pulses, a third clock pulse lagged by π/8 phase for a third reference clock signal lagged by π/2 phase for said first reference clock signal, and said eighth clock pulse lagged by π/8 phase for said eighth reference clock signal lagged by 7π/4 phase for said first reference clock signal;

a fifth AND circuit which applies AND to said edge pulses, a fourth clock pulse lagged by π/8 phase for a fourth reference clock signal lagged by 3π/4 phase for said first reference clock signal, and said first clock pulse lagged by π/8 phase for said first reference clock signal;

a sixth AND circuit which applies AND to said edge pulses, said fifth clock pulse lagged by π/8 phase for said fifth reference clock signal lagged by n phase for said first reference clock signal, and said second clock pulse lagged by π/8 phase for said second reference clock signal lagged by π/4 phase for said first reference clock signal;

a seventh AND circuit which applies AND to said edge pulses, said sixth clock pulse lagged by π/8 phase for said sixth reference clock al signal lagged by 5π/4 phase for said first reference clock signal, and said third clock pulse lagged by π/8 phase for said third reference clock signal lagged by π/2 phase for said first reference clock signal;

an eighth AND circuit which applies AND to said edge pulses, said seventh clock pulse lagged by π/8 phase for said seventh reference clock signal lagged by 3π/2 phase for said first reference clock signal, and said fourth clock pulse lagged by π/8 phase for said fourth reference clock signal lagged by 3π/4 phase for said first reference clock signal;

a first set-reset flip flop (SR-F/F) whose set terminal outputs from said first AND circuit are inputted to and whose reset terminal said first clock pulse is inputted to;

a second SR-F/F whose set terminal outputs from said second AND circuit are inputted to and whose reset terminal said second clock pulse is inputted to;

a third SR-F/F whose set terminal outputs from said third AND circuit are inputted to and whose reset terminal said third clock pulse is inputted to;

a fourth SR-F/F whose set terminal outputs from said fourth AND circuit are inputted to and whose reset terminal said fourth clock pulse is inputted to;

a fifth SR-F/F whose set terminal outputs from said fifth AND circuit are inputted to and whose reset terminal said fifth clock pulse is inputted to;

a sixth SR-F/F whose set terminal outputs from said sixth AND circuit are inputted to and whose reset terminal said sixth clock pulse is inputted to;

a seventh SR-F/F whose set terminal outputs from said seventh AND circuit are inputted to and whose reset terminal said seventh clock pulse is inputted to;

an eighth SR-F/F whose set terminal outputs from said eighth AND circuit are inputted to and whose reset terminal said eighth clock pulse is inputted to;

a first delay circuit which makes outputs from said first SR-F/F lag by π/8 phase;

a second delay circuit which makes outputs from said second SR-F/F lag by π/8 phase;

a third delay circuit which makes outputs from said third SR F/F lag by π/8 phase;

a fourth delay circuit which makes outputs from said fourth SR-F/F lag by π/8 phase;

a fifth delay circuit which makes outputs from said fifth SR-F/F lag by π/8phase;

a sixth delay circuit which makes outputs from said sixth SR F/F lag by π/8 phase;

a seventh delay circuit which makes outputs from said seventh SR-F/F lag by π/8 phase;

an eighth delay circuit-which makes outputs from said eighth SR-F/F lag by π/8 phase;

a first phase frequency detector (PFD) which compares the phases of pulses outputted from said first delay circuit with the phase of the inverted output pulse from said first SR-F/F and outputs pulses of the pulse widths in proportion to the phase difference between the compared pulses;

a second PFD which compares the phases of pulses outputted from said second delay circuit with the phase of the inverted output pulse from said second SR-F/F and outputs pulses of the pulse widths in proportion to the phase difference between the compared pulses;

a third PFD which compares the phases of pulses outputted from said third delay circuit with the phase of the inverted output pulse from said third SR-F/F and outputs pulses of the pulse widths in proportion to the phase difference between the compared pulses;

a fourth PFD which compares the phases of pulses outputted from said fourth delay circuit with the phase of the inverted output pulse from said fourth SR-F/F and outputs pulses of the pulse widths in proportion to the phase difference between the compared pulses;

a fifth PFD which compares the phases of pulses outputted from said fifth delay circuit with the phase of the inverted output pulse from said fifth SR-F/F and outputs pulses of the pulse widths in proportion to the phase difference between the compared pulses;

sixth PFD which compares the phases of pulses outputted from said sixth delay circuit with the phase of the inverted output pulse from said sixth SR-F/F and outputs pulses of the pulse widths in proportion to the phase difference between the compared pulses;

a seventh PFD which compares the phases of pulses outputted pulse from said seventh SR-F/F and outputs pulses of the pulse widths in proportion to the phase difference between the compared pulses; and an eighth PFD which compares the phases of pulses outputted from said eighth delay circuit with the phase of the inverted output pulse from said eighth. SR-F/F and outputs pulses of the pulse widths in proportion to the phase difference between the compared inputted serial random data and reference clock signal pulses.

6. A phase detecting method, which is performed by phase frequency detectors that compare a phase of a reference clock signal whose frequency is controlled to be about V2 Hz for inputted serial random data whose data rate is "f" bit per second (bps) with phases of said inputted serial random data and output pulses of the pulse widths in proportion to the phase difference between the compared result pulses of said reference clock signal and said inputted serial random data, comprising the steps of;

generating multi clock signals being said reference clock signal whose frequency is controlled to be about V2 Hz for said inputted serial random data whose data rate is "f" bps, and a plurality of clock pulses whose phases are different from said reference clock signal;

detecting edges of rising edges and falling edges of said inputted serial random data; selecting whether said detected edges of said inputted serial random data are compared their phases with rising edges or falling edges of said reference clock signal, and outputting first edge pulses synchronized with edges which are judged to be compared their phases with said rising edges of said reference clock signal and second edge pulses synchronized with edges which are judged to be compared their phases with said falling edges of said reference clock signal;

edge position correcting so that the frequency of a first clock pulse becomes equal to the frequency of said first edge pulses by selecting only edges of said first clock pulses which perform phase comparison with said first edge pulses in the edges of said first clock pulses which are used at the phase comparison with the rising edges of said reference clock signals, and making edges of said first edge pulses lag by phase difference between said reference clock signal and said first clock pulse;

edge position correcting so that the frequency of a second clock pulses becomes equal to the frequency of said second edge pulses by selecting only edges of said second clock pulses which perform phase comparison with said second edge pulses in the edges of said second clock pulses which are used at the phase comparison with the falling edges of said reference clock signal, and making edges of said second edge pulses lag by phase difference between said reference clock signal and said second clock pulse;

detecting phase frequency for comparing phases between said first clock pulses whose frequency is equal to the frequency of said first edge pulses, outputted at said edge position correcting, and said first edge pulses whose phases are made to lag by said phase difference, and outputting pulses of the pulse widths in proportion to said phase difference between said both pulses; and detecting phase frequency for comparing phases between said second clock pulses whose frequency is equal to the frequency of said second edge pulses, outputted at said edge position correcting, and said second edge pulses whose phases are made to lag by said phase difference, and outputting pulses of the pulse widths in proportion to said phase difference between the both inputted serial random data and reference clock signal pulses.

7. A phase detecting method, which is performed by phase frequency detectors that compare phases of reference clock signals whose frequency is controlled to be about f/n (n is an integer) Hz for inputted serial random data whose data rate is "f" bit per second (bps) with phases of said inputted serial random data and output pulses of the pulse widths in proportion to the phase difference between the compared result pulses of said reference clock signals and said inputted serial random data, comprising the steps of;

generating multi phase clock signals being a plurality of reference clock signals whose phases are serially different respectively and whose frequency is controlled to be about f/n Hz for inputted serial random data whose data rate is "f" bit per second (bps), and a plurality of clock pulses whose phases are different from said plurality of reference clock signals by a designated value detecting edges of rising edges and falling edges of said inputted serial random data and generating edge pulses synchronized with said rising and falling edges;

selecting detected edges of said inputted serial random data at said detecting edges are compared their phases with any of said reference clock signals generated at said multi phase clock generating, and outputting edge pulses synchronized with selected edges of said inputted serial random data in each reference clock signal;

edge position correcting so that the frequency of said clock pulses becomes equal to the frequency of edge pulses by selecting only edges using for phase comparison with said edge pulses in the edges of said clock pulses set each of said reference clock signals which are used at the phase comparison with edge pulses generated each of said reference clock signals, and making edges of said edge pulses lag by phase difference between said reference clock signals and said clock pulses set each of said reference clock signals; and detecting phase frequency for comparing phases between said clock pulses whose frequency is equal to the frequency of said edge pulses, outputted at said edge position correcting, and said edge pulses whose phases are made to lag by said phase difference, and outputting pulses of the pulse widths in proportion to said phase difference between the both inputted serial random data and reference clock signal pulses.

* * * * *